US012660084B2

(12) United States Patent
Tang et al.

(10) Patent No.: US 12,660,084 B2
(45) Date of Patent: Jun. 16, 2026

(54) SUBSTRATE AND ELECTRONIC APPARATUS

(71) Applicants: Hefei BOE Ruisheng Technology Co., Ltd., Hefei (CN); BOE TECHNOLOGY GROUP CO., LTD., Beijing (CN)

(72) Inventors: Hai Tang, Beijing (CN); Liang Gao, Beijing (CN); Chengguo Wang, Beijing (CN); Zhongbao Wu, Beijing (CN); Yiding Sun, Beijing (CN); Ming Zhai, Beijing (CN); Linjie Huang, Beijing (CN); Chengcheng Kong, Beijing (CN)

(73) Assignees: Hefei BOE Ruisheng Technology Co., Ltd., Hefei (CN); BOE Technology Group Co., Ltd., Beijing (CN)

( * ) Notice: Subject to any disclaimer, the term of this patent is extended or adjusted under 35 U.S.C. 154(b) by 255 days.

(21) Appl. No.: 18/699,718

(22) PCT Filed: Aug. 19, 2022

(86) PCT No.: PCT/CN2022/113759
§ 371 (c)(1),
(2) Date: Apr. 9, 2024

(87) PCT Pub. No.: WO2024/036636
PCT Pub. Date: Feb. 22, 2024

(65) Prior Publication Data
US 2024/0407087 A1 Dec. 5, 2024

(51) Int. Cl.
*H05K 1/02* (2006.01)
*H05K 1/181* (2026.01)

(52) U.S. Cl.
CPC .......... *H05K 1/0296* (2013.01); *H05K 1/181* (2013.01); *H05K 2201/10022* (2013.01); *H05K 2201/10136* (2013.01)

(58) Field of Classification Search
CPC ................... H05K 1/0245; H05K 2201/09036
(Continued)

(56) References Cited

U.S. PATENT DOCUMENTS 8,508,111 B1 8/2013 Xi et al.
2003/0173606 A1 9/2003 Takashima
(Continued)

FOREIGN PATENT DOCUMENTS

CN 105468202 A 4/2016
CN 105742330 A 7/2016
(Continued)

*Primary Examiner* — Andargie M Aychillhum
(74) *Attorney, Agent, or Firm* — The Webb Law Firm

(57) ABSTRACT

A substrate includes a device region and at least one bonding region close to any edge of the substrate relative to the device region. The substrate includes a base, device groups arranged in a first direction and a second direction, signal line groups and bridging portions. A device group includes at least one electronic element. A signal line group includes signal lines extending in the second direction and arranged at intervals in the first direction. At least one bridging portion includes a conductive portion. At least two signal lines in at least one signal line group and electrically connected by a conductive portion, and/or at least one signal line in at least one signal line group includes at least two sub-portions spaced apart in the second direction, and two adjacent sub-portions in the same signal line are electrically connected by a conductive portion.

20 Claims, 19 Drawing Sheets

(58) Field of Classification Search
  USPC ......................................................... 361/782
  See application file for complete search history.

(56)                References Cited

U.S. PATENT DOCUMENTS

| | | | |
|---|---|---|---|
| 2008/0158493 A1 | 7/2008 | Park | |
| 2015/0305159 A1* | 10/2015 | Yamamoto | H01G 4/30 |
| | | | 361/767 |
| 2021/0019007 A1 | 1/2021 | Park et al. | |
| 2022/0085306 A1* | 3/2022 | Peng | G02F 1/133351 |

FOREIGN PATENT DOCUMENTS

| | | | |
|---|---|---|---|
| CN | 107863359 A | 3/2018 | |
| CN | 108258103 A | 7/2018 | |
| CN | 109285451 A | 1/2019 | |
| CN | 109521611 A | 3/2019 | |
| CN | 110718577 A | 1/2020 | |
| CN | 211123565 U | 7/2020 | |
| CN | 112289810 A | 1/2021 | |
| CN | 113823657 A | 12/2021 | |
| CN | 114220384 A | 3/2022 | |
| CN | 114220807 A | 3/2022 | |
| CN | 114220825 A | 3/2022 | |
| CN | 216719948 U | 6/2022 | |
| JP | 2004253303 A | 9/2004 | |
| JP | 2009109875 A | 5/2009 | |
| WO | 2021249120 A1 | 12/2021 | |
| WO | 2022134019 A1 | 6/2022 | |

* cited by examiner

200

200

214  
212  
216  
210  
120  
101  
100

A-A

194          M2          131d          1312

194          1312

B          B

B-B

194    M2    1312          131d          M2    1312

D2-D2

100

SUBSTRATE AND ELECTRONIC APPARATUS

CROSS-REFERENCE TO RELATED APPLICATION

This application is the United States national phase of International Patent Application No. PCT/CN2022/113759, filed Aug. 19, 2022, the disclosure of which is hereby incorporated by reference in its entirety.

BACKGROUND OF THE INVENTION

Field of the Invention

The present disclosure relates to the field of display technologies, and in particular, to a substrate and an electronic apparatus.

Description of Related Art

The substrate usually includes electronic elements and signal lines. The signal lines are electrically connected to the electronic elements to achieve signal transmission.

SUMMARY OF THE INVENTION

In an aspect, a substrate is provided. The substrate has a plurality of edges. The substrate includes a device region and at least one bonding region, and the bonding region is disposed proximate to any edge of the substrate relative to the device region. The substrate includes a base, a plurality of device groups, a plurality of signal line groups, and a plurality of bridging portions. The plurality of device groups are located on a side of the base, and the plurality of device groups are located in the device region. The plurality of device groups are arranged in a first direction and a second direction, the first direction intersects the second direction, and the first direction and the second direction are parallel to the base. A device group includes at least one electronic element. The plurality of signal line groups are located on a same side of the base as the plurality of device groups. A signal line group includes a plurality of signal lines. The plurality of signal lines all extend in the second direction, and the plurality of signal lines are disposed at intervals in the first direction. Any signal line extends from the bonding region to the device region, and any signal line is electrically connected to a column of device groups arranged in the second direction. The plurality of bridging portions are located on the same side of the base as the plurality of device groups. At least one bridging portion is located in the device region, and the at least one bridging portion includes a conductive portion. The at least one bridging portion satisfies at least one of: at least two signal lines in at least one signal line group are electrically connected by a conductive portion; and at least one signal line in at least one signal line group includes at least two sub-portions disposed at intervals in the second direction, and two adjacent sub-portions in a same signal line are electrically connected by a conductive portion. At least part of a side of any bridging portion away from the base is capable of reflecting light.

In some embodiments, at least part of a surface of the conductive portion included in the at least one bridging portion away from the base is capable of reflecting light.

In some embodiments, the at least one bridging portion further includes a first encapsulation portion, and the first encapsulation portion covers the conductive portion. A material of the first encapsulation portion includes at least one of a transparent material and a reflective material.

In some embodiments, the at least one bridging portion further includes a first encapsulation portion, and the first encapsulation portion covers the conductive portion. At least part of a surface of the first encapsulation portion away from the base is capable of reflecting light.

In some embodiments, the conductive portion includes a main body portion and two connection portions. The two connection portions are connected to both ends of the main body portion. A maximum distance between a surface of the main body portion facing the base and the base is greater than a maximum distance between a surface of any connection portion facing the base and the base.

In some embodiments, an orthographic projection of the main body portion on the base is in a shape of a first rectangle, and a length of the first rectangle is in a range of 0.5 mm to 25 mm, inclusive, and a width of the first rectangle is in a range of 0.2 mm to 3 mm, inclusive. And/or, an orthographic projection of any connection portion on the base is in a shape of a second rectangle, a length of the second rectangle is in a range of 0.2 mm to 3 mm, inclusive, and a width of the second rectangle is in a range of 0.2 mm to 3 mm, inclusive.

In some embodiments, a maximum distance between the surface of the main body portion facing the base and a surface of the connection portion facing the base is a first distance, and the first distance is in a range of 0.1 mm to 0.8 mm, inclusive. And/or, a maximum distance between a surface of the main body portion away from the base and the surface of the connection portion facing the base is a second distance, and the second distance is in a range of 0.2 mm to 1 mm, inclusive.

In some embodiments, the substrate further includes a first reflective layer. The first reflective layer is located on a side of the plurality of device groups, the plurality of signal line groups and the plurality of bridging portions away from the base. The first reflective layer has a plurality of first functional regions, and an orthographic projection of at least one bridging portion on the base is located within an orthographic projection of a first functional region on the base. The first reflective layer is provided with a plurality of first linear slits therein, and any first linear slit penetrates the first reflective layer in a direction perpendicular to the base. The first functional region is composed of multiple first linear slits spaced apart from each other by surrounding.

In some embodiments, a ratio of an area of an orthographic projection of any bridging portion on the base to an area of a first functional region where an orthographic projection of the bridging portion on the base is located is in a range of 0.5 to 2, inclusive.

In some embodiments, a length of the first linear slit is in a range of 1 mm to 5 mm, inclusive; and a width of the first linear slit is in a range of 50 μm to 300 μm, inclusive.

In some embodiments, the first reflective layer is provided with a plurality of second linear slits therein, any second linear slit penetrates the first reflective layer in the direction perpendicular to the base, and any second linear slit is located in the first functional region. An orthographic projection of an edge of the second linear slit on the base is at least partially overlapped with an orthographic projection of the bridging portion on the base.

In some embodiments, a ratio of a length of the second linear slit to a length of a longest side of the bridging portion is in a range of 0.9 to 1.5, inclusive.

In some embodiments, the length of the second linear slit is in a range of 1 mm to 35 mm, inclusive; and a width of the second linear slit is in a range of 50 μm to 300 μm, inclusive.

In some embodiments, the electronic element includes an optical element. The substrate further includes a second encapsulation portion, and the second encapsulation portion covers the optical element. A material of the second encapsulation portion is a transparent material. The first reflective layer is provided with a first through hole therein, and an orthographic projection of the optical element on the base is located within a region surrounded by an orthographic projection of an edge of the first through hole on the base.

In some embodiments, the electronic element includes a non-optical element. The substrate further includes a third encapsulation portion, the third encapsulation portion covers the non-optical element, and the first reflective layer covers the third encapsulation portion.

In some embodiments, the first reflective layer has a second functional region, and at least part of an orthographic projection of the non-optical element on the base is located within the second functional region. The first reflective layer is provided with a plurality of third linear slits therein, any third linear slit penetrates the first reflective layer in the direction perpendicular to the base, and any third linear slit is located in the second functional region. An orthographic projection of an edge of the third linear slit on the base is at least partially overlapped with the orthographic projection of the non-optical element on the base.

In some embodiments, at least two third linear slits are located in a same second functional region, and orthographic projections of edges of the at least two third linear slits located in the same second functional region on the base are arranged in an "X" shape.

In some embodiments, two third linear slits are located in the same second functional region. A ratio of a length of the third linear slit to a maximum size of the non-optical element is in a range of 0.9 to 2.5, inclusive. And/or, a ratio of the length of the third linear slit to a maximum size of the third encapsulation portion is in a range of 0.9 to 2.5, inclusive.

In some embodiments, the conductive portion is a chip resistor or a conductive adhesive.

In another aspect, an electronic apparatus is provided. The electronic apparatus includes the substrate as described in the above embodiments.

BRIEF DESCRIPTION OF THE DRAWINGS

In order to describe technical solutions in the present disclosure more clearly, accompanying drawings to be used in some embodiments of the present disclosure will be introduced briefly below. Obviously, the accompanying drawings to be described below are merely accompanying drawings of some embodiments of the present disclosure, and a person of ordinary skill in the art may obtain other drawings according to these drawings. In addition, the accompanying drawings to be described below may be regarded as schematic diagrams, but are not limitations on an actual size of a product, an actual process of a method and an actual timing of a signal to which the embodiments of the present disclosure relate.

DESCRIPTION OF THE INVENTION

Figures 1A, 1B:
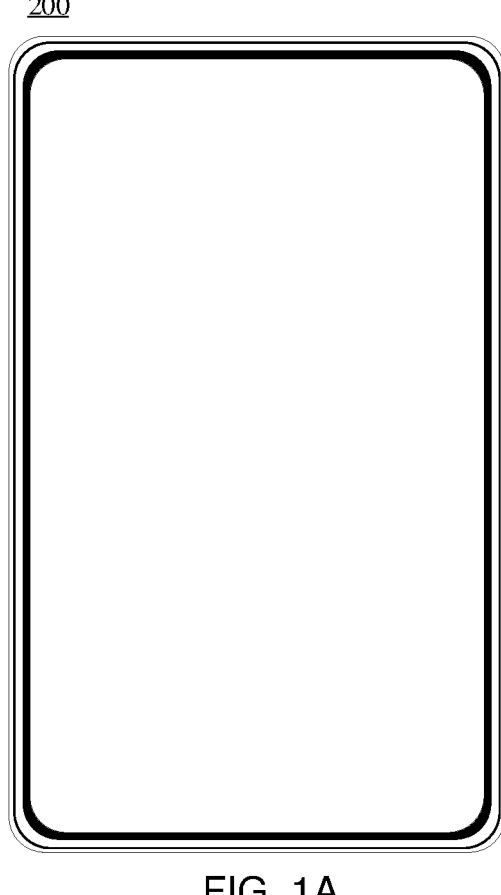
FIG. 1A is a structural diagram of an electronic apparatus, in accordance with some embodiments.
FIG. 1B is a structural diagram of another electronic apparatus, in accordance with some embodiments.

Technical solutions in some embodiments of the present disclosure will be described clearly and completely with reference to the accompanying drawings below. Obviously, the described embodiments are merely some but not all embodiments of the present disclosure. All other embodiments obtained by a person of ordinary skill in the art based on the embodiments of the present disclosure shall be included in the protection scope of the present disclosure.

Unless the context requires otherwise, throughout the description and the claims, the term "comprise" and other forms thereof such as the third-person singular form "comprises" and the present participle form "comprising" are construed as open and inclusive, i.e., "including, but not limited to". In the description of the specification, the terms such as "one embodiment", "some embodiments", "exemplary embodiments", "example", "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials, or characteristics described herein may be included in any one or more embodiments or examples in any suitable manner.

Hereinafter, the terms such as "first" and "second" are used for descriptive purposes only, and are not to be construed as indicating or implying the relative importance or implicitly indicating the number of indicated technical features. Thus, features defined with "first" or "second" may explicitly or implicitly include one or more of the features. In the description of the embodiments of the present disclosure, the term "a plurality of" or "the plurality of" means two or more unless otherwise specified.

In the description of some embodiments, the expressions "connected" and derivatives thereof may be used. For example, the term "connected" may be used in the description of some embodiments to indicate that two or more components are in direct physical or electrical contact with each other.

The phrase "at least one of A, B and C" has a same meaning as the phrase "at least one of A, B or C", and they both include the following combinations of A, B and C: only A, only B, only C, a combination of A and B, a combination of A and C, a combination of B and C, and a combination of A, B and C.

The phrase "A and/or B" includes the following three combinations: only A, only B, and a combination of A and B.

The term "about", "substantially" or "approximately" as used herein includes a stated value and an average value within an acceptable range of deviation of a particular value.

The acceptable range of deviation is determined by a person of ordinary skill in the art in consideration of the measurement in question and errors associated with the measurement of a particular quantity (i.e., limitations of the measurement system).

The term such as "parallel", "perpendicular" or "equal" as used herein includes a stated condition and a condition similar to the stated condition. A range of the similar condition is within an acceptable range of deviation. The acceptable range of deviation is determined by a person of ordinary skill in the art in view of measurement in question and errors associated with the measurement of a particular quantity (i.e., limitations of the measurement system). For example, the term "parallel" includes absolute parallelism and approximate parallelism, and an acceptable range of deviation of the approximate parallelism may be a deviation within 5°; the term "perpendicular" includes absolute perpendicularity and approximate perpendicularity, and an acceptable range of deviation of the approximate perpendicularity may also be a deviation within 5°; and the term "equal" includes absolute equality and approximate equality, and an acceptable range of deviation of the approximate equality may be a difference between two equals being less than or equal to 5% of either of the two equals.

It will be understood that when a layer or element is referred to as being on another layer or substrate, the layer or element may be directly on the another layer or substrate, or there may be intermediate layer(s) between the layer or element and the another layer or substrate.

Exemplary embodiments are described herein with reference to sectional views and/or plan views as idealized exemplary drawings. In the accompanying drawings, thicknesses of layers and sizes of regions are enlarged for clarity. Variations in shapes relative to the accompanying drawings due to, for example, manufacturing technologies and/or tolerances may be envisaged. Therefore, the exemplary embodiments should not be construed to be limited to the shapes of regions shown herein, but to include deviations in the shapes due to, for example, manufacturing. Therefore, the regions shown in the accompanying drawings are schematic in nature, and their shapes are not intended to show actual shapes of the regions in an apparatus, and are not intended to limit the scope of the exemplary embodiments.

FIG. 1A is a structural diagram of an electronic apparatus in accordance with some embodiments.

As shown in FIG. 1A, some embodiments of the present disclosure provide an electronic apparatus 200. In some examples, the electronic apparatus 200 may be a product with an image display function. For example, the electronic apparatus 200 may be used to display still images, such as pictures or photos. The electronic apparatus 200 may also be used to display dynamic images, such as a video or game images.

In some examples, the electronic apparatus 200 may be a notebook computer, a mobile telephone, a wireless device, a personal digital assistant (PDA), a hand-held or portable computer, a global positioning system (GPS) receiver/navigator, a camera, an MPEG-4 Part 14 (MP4) video player, a video camera, a game console, a watch, a clock, a calculator, a television (TV) monitor, a flat-panel display, a computer monitor, a car display (e.g., an odometer display), a navigator, a cockpit controller and/or display, a camera view display (e.g., a rear view camera display in a vehicle), an electronic photo, an electronic billboard or sign, a projector, a packaging and aesthetic structure (e.g., a display for displaying an image of a piece of jewelry), and the like.

In some other examples, the electronic apparatus 200 may also be a product without image display function.

Embodiments of the present disclosure do not further limit the display apparatus 200. The following will be described by considering an example where the electronic apparatus 200 is a product with an image display function.

FIG. 1B is a structural diagram of another electronic apparatus in accordance with some embodiments.

As shown in FIG. 1B, in some embodiments, the electronic apparatus 200 may include a substrate 100 and a display panel 210. For example, the substrate 100 is used to emit light outward, and the display panel 210 is located on a light exit side of the substrate 100 and used to display image information.

In some examples, the display panel 210 is a liquid crystal display panel, and the substrate 100 is used to provide backlight to the display panel 210.

In some examples, the substrate 100 may be used to emit white light or blue light. The display panel 210 may filter or convert the light emitted by the substrate 100 to obtain red light, green light, and blue light, so that the electronic apparatus 200 can realize full-color image display.

The display panel 210 will be described below by taking an example where the display panel 210 is a liquid crystal display panel.

In some examples, as shown in FIG. 1B, the display panel 210 includes an array substrate 216, an opposite substrate 214, and a liquid crystal layer 212 located between the array substrate 216 and the opposite substrate 214. It can be understood that the light emitted by the substrate 100 can pass through the array substrate 216 to be irradiated to the liquid crystal layer 212. The liquid crystal layer 212 includes liquid crystal molecules. By controlling deflection angles of the liquid crystal molecules, the intensity of light passing through the liquid crystal layer 212 to be irradiated to the opposite substrate 214 may be controlled, thereby enabling the electronic apparatus 200 to implement the image display function.

In some examples, in a case where the substrate 100 is used to emit white light, the opposite substrate 214 may include a red filter film, a green filter film and a blue filter film. By controlling intensities of lights irradiated to the red filter film, the green filter film and the blue filter film, red light, green light and blue light of different intensities may be obtained, so that the electronic apparatus 200 may display color images.

In some other examples, in a case where the substrate 100 is used to emit blue light, the opposite substrate 214 may include color conversion films. For example, the color conversion films may be quantum dot films. The blue light may be converted into red light after being irradiated to a red quantum dot film, and the blue light may be converted into green light after being irradiated to a green quantum dot film. The red light and the green light converted by the quantum dot films are mixed with the blue light emitted by the substrate 100, so that the electronic apparatus 200 may achieve full-color image display.

In still other examples, in a case where the substrate 100 is used to emit blue light, the opposite substrate 214 may not include quantum dot films, and the substrate 100 includes quantum dot films. For example, the quantum dot films may be disposed on a side of light-emitting devices (electronic elements 120) in the substrate 100 away from a base 101. In some examples, the display panel 210 includes a common electrode and a plurality of pixel electrodes. An electric field may be generated between the common electrode and each pixel electrode. By controlling a voltage value of each pixel electrode, the intensity of the electric field generated between the common electrode and each pixel electrode may be controlled, thereby playing a control role on deflection angles of the liquid crystal molecules in the liquid crystal layer 212, that is, playing a control role on the intensity of light passing through the liquid crystal layer 212.

In some examples, the pixel electrodes may be disposed in the array substrate 216, and the common electrode may be disposed in the array substrate 216 or the opposite substrate 214.

Figure 2A:
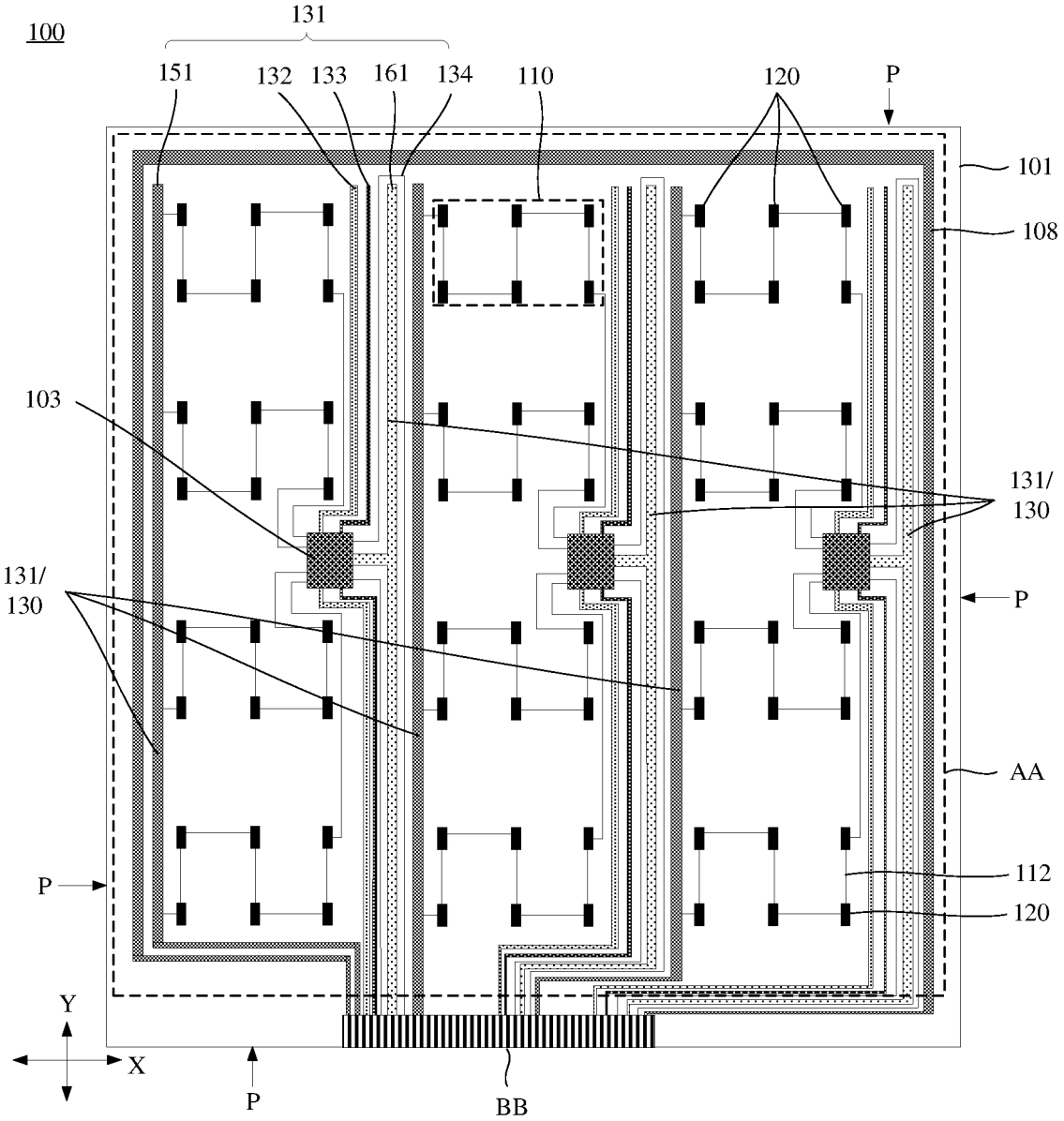
FIG. 2A is a structural diagram of a substrate, in accordance with some embodiments.
Figure 2B:
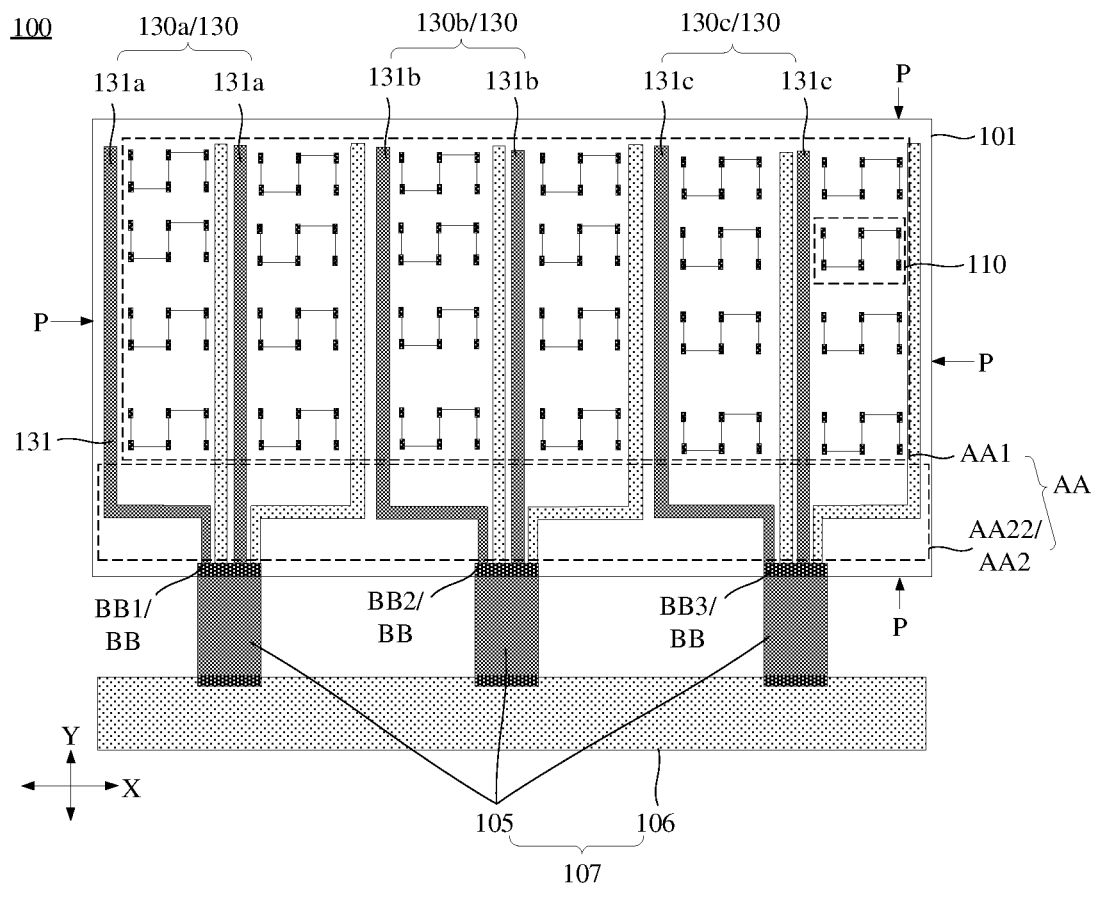
FIG. 2B is a structural diagram of another substrate, in accordance with some embodiments.
Figure 2C:
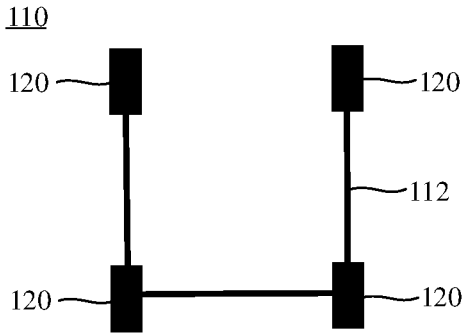
FIG. 2C is a structural diagram of a device group, in accordance with some embodiments.
Figure 2D:
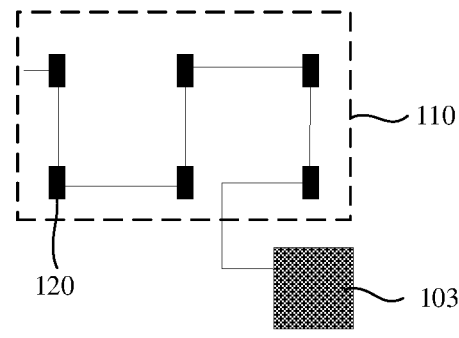
FIG. 2D is a structural diagram of a driver chip and a device group, in accordance with some embodiments.
Figure 2E:
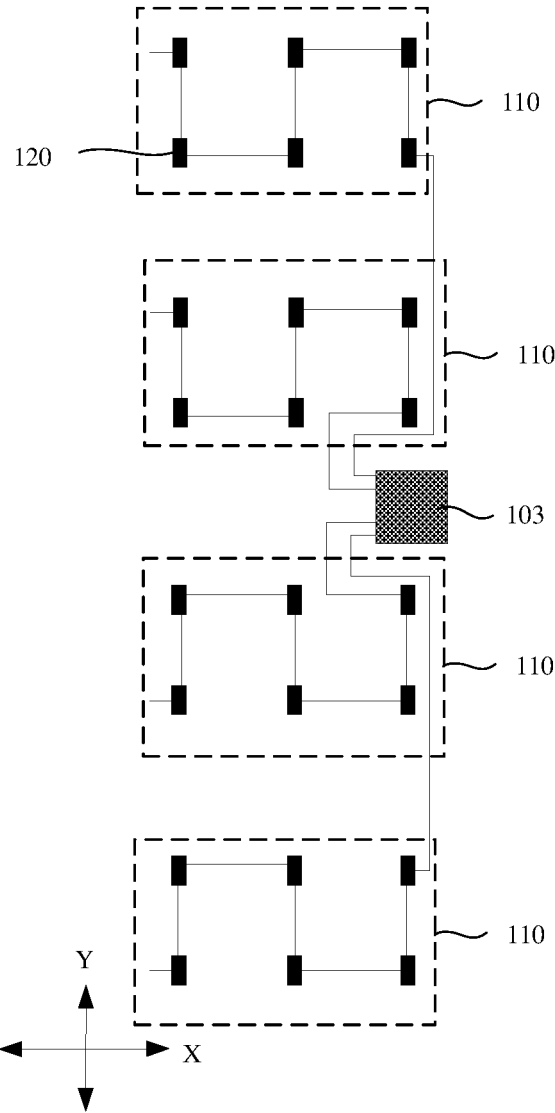
FIG. 2E is a structural diagram of another driver chip and device groups, in accordance with some embodiments.

FIG. 2A is a structural diagram of a substrate in accordance with some embodiments. FIG. 2B is a structural diagram of another substrate in accordance with some embodiments. FIG. 2C is a structural diagram of a device group in accordance with some embodiments. FIG. 2D is a structural diagram of a structural diagram of a driver chip and a device group in accordance with some embodiments. FIG. 2E is a structural diagram of another driver chip and another device group in accordance with some embodiments. The substrate 100 will be illustrated below with reference to FIGS. 2A to 2E.

In some embodiments, as shown in FIGS. 2A and 2B, the substrate 100 has a plurality of edges P. It can be understood that the edges P of the substrate 100 may be straight segments or curved segments. In some examples, as shown in FIGS. 2A and 2B, the substrate 100 may be in a shape of a square or a rectangle, that is, the substrate 100 may have four edges P.

In some other examples, the substrate 100 may be in a shape of a polygon or another irregular shape. The embodiments of the present disclosure do not further limit the shape of the substrate 100 and the number of the edges of the substrate 100.

As shown in FIGS. 2A and 2B, the substrate 100 includes a device region AA and at least one bonding region BB. The bonding region(s) BB are provided proximate to any edge P of the substrate 100 relative to the device region AA.

It can be understood that an edge of the bonding region BB proximate to the device region AA is adjacent to an edge of the device region AA proximate to the bonding region BB. It will be noted that in the accompanying drawings of the specification of the present disclosure, taking FIGS. 2A and 2B as an example, the edge of the device region AA shown in the dotted box and the edge of the bonding region BB are spaced apart from each other. It is just to clearly distinguish the device region AA and the bonding region BB, but the edge positions of device region AA and the bonding region BB are not further limited.

The bonding region(s) BB are provided proximate to any edge P of the substrate 100 relative to the device region AA, which means that the bonding region(s) BB may be located between the device region AA and the any edge P.

In some examples, as shown in FIGS. 2A and 2B, the bonding region(s) BB are located on a side of the device region AA in the second direction Y. For example, the second direction Y is a vertical direction.

In some examples, as shown in FIG. 2A, there is one bonding region BB. In some other examples, as shown in FIG. 2B, there are a plurality of bonding regions BB. For example, the number of the bonding region(s) BB may be two, three or four.

It can be understood that, as shown in FIG. 2B, in a case where there are the plurality of bonding regions BB, the plurality of bonding regions BB are located on the same side of the device region AA, that is, the plurality of bonding regions BB are arranged on the same edge P.

In some examples, as shown in FIG. 2B, in a case where there are the plurality of bonding regions BB, the plurality of bonding regions BB may be arranged at intervals in the first direction X. For example, the first direction X is a horizontal direction, and the first direction X may be perpendicular to the second direction Y. It can be understood that the plurality of bonding regions BB may be arranged at equal intervals, or distances each between any two adjacent bonding regions BB in the plurality of bonding regions BB may be different.

As shown in FIGS. 2A and 2B, the substrate 100 includes a base 101 and a plurality of device groups 110. The plurality of device groups 110 are located on a side of the base 101, and the plurality of device groups 110 are located in the device region AA. The plurality of device groups 110 are arranged in the first direction X and the second direction Y, the first direction X intersects the second direction Y, and the first direction X and the second direction Y are parallel to the base 101. A device group 110 includes at least one electronic element 120.

In some examples, the base 101 is a rigid substrate. In some other examples, the base 101 is a flexible substrate. For example, the material of the base 101 includes any of plastic, FR-4 grade material, resin, glass, quartz, polyimide (PI) or polymethyl methacrylate (PMMA).

It can be understood that the plurality of device groups 110 are located on the same side of the base 101 and are located in the device region AA. In some examples, the plurality of device groups 110 are arranged at intervals in the first direction X. In the first direction X, gaps each between two adjacent device groups 110 are the same or approximately the same. The plurality of device groups 110 are arranged at intervals in the second direction Y. In the second direction Y, gaps each between two adjacent device groups 110 are the same or approximately the same. In this way, as shown in FIGS. 2A and 2B, the plurality of device groups 110 may be arranged in a plurality of rows in the first direction X and in a plurality of columns in the second direction Y. It can be understood that the plurality of rows of device groups 110 are spaced apart in the second direction Y, and the plurality of columns of device groups 110 are spaced apart in the first direction X.

It will be noted that in the accompanying drawings of the specification of the present disclosure, in order to clearly illustrate the structure of the substrate 100, only four rows and three columns of device groups 110 are shown (e.g., in FIG. 2A), or four rows and six columns of device groups 110 are shown (e.g., in FIG. 2B). The number and arrangement of the device groups 110 in the embodiments of the present disclosure are not further limited.

It can be understood that a device group 110 may include one electronic element 120 or a plurality of electronic elements 120.

In some examples, in a case where the device group 110 includes a plurality of electronic elements 120, the plurality of electronic elements 120 may be components of the same type or components of different types. For example, in a case where the substrate 100 is used to emit light, the electronic elements 120 may be light-emitting devices. A plurality of light-emitting devices included in the device group 110 may be used to emit light of the same color; or the plurality of light-emitting devices included in the device group 110 may be used to emit light of multiple different colors. Alternatively, in the plurality of electronic elements 120 included in the device group 110, some (one or more) are light-emitting devices for emitting light, and the other (one or more) are other components (e.g. sensor chips) for achieving other functions.

In some examples, as shown in FIGS. 2A and 2B, a device group 110 may include six electronic elements 120. In some other examples, as shown in FIG. 2C, a device group 110 may include four electronic elements 120. In still other examples, a device group 110 may include two, three or five electronic elements 120. It can be understood that different device groups 110 may include the same number or different numbers of electronic elements 120. The embodiments of the present disclosure do not limit the number of the electronic elements 120 in a device group 110.

In some examples, as shown in FIG. 2C, in a case where a device group 110 includes four electronic elements 120, a distance between two adjacent electronic elements 120 in the first direction X is approximately 13.775 mm.

In some examples, as shown in FIGS. 2A and 2B, in a case where a device group 110 includes a plurality of electronic elements 120, the plurality of electronic elements 120 may be arranged in a matrix, that is, each of the plurality of electronic elements 120 may be arranged at one of four vertices of a rectangle or a square, thereby improving the regularity of the arrangement of the plurality of electronic elements 120.

In some other examples, in a case where a device group 110 includes a plurality of electronic elements 120, the plurality of electronic elements 120 in the device group 110 may be arranged at vertices of hexagons, octagons, or other irregular shapes. Alternatively, the plurality of electronic elements 120 in the device group 110 may be arranged in a circle or an ellipse, so as to meet different usage requirements.

In some examples, as shown in FIG. 2C, the plurality of electronic elements 120 in the device group 110 are electrically connected by connection lines 112. For example, there are a plurality of connection lines 112, and the plurality of electronic elements 120 in the device group 110 may be connected in series by the plurality of connection lines 112. In this way, by providing electrical signals to any electronic element 120 in a device group 110, the electrical signals may be provided to each electronic element 120 in the device group 110, thereby improving wiring convenience of the substrate 100.

It can be seen from the above that, in some examples, the substrate 100 may be used to provide a light source. In this case, the electronic elements 120 may be light-emitting devices. For example, the electronic elements 120 may be light-emitting diodes (LEDs).

In some examples, the electronic element 120 may be any of a traditional LED, a mini light-emitting diode (mini LED) or a micro light-emitting diode (micro LED).

For example, the traditional LED means that the size of the LED is greater than or equal to 500 μm. The mini LED means that the size of the LED is greater than or equal to 100 μm and less than 500 μm. The micro LED means that the size of the LED is less than 100 μm. In some examples, the size of the micro LED may be less than or equal to 50 μm.

In some examples, the electronic elements 120 in each device group 110 may be used to emit light of the same color. For example, the electronic elements 120 in each device group 110 are all used to emit white light. Alternatively, the electronic elements 120 in each device group 110 are all used to emit blue light. As a result, the substrate 100 may emit light of a specific color.

In some examples, each electronic element 120 in a device group 110 has the same luminous brightness. The electronic elements 120 in different device groups 110 may have the same or different luminous brightness. By controlling the luminous brightness of the electronic elements 120 in different device groups 110, brightness of different regions of the substrate 100 may be controlled to meet different usage requirements.

It can be seen from the above that, in some embodiments, the electronic apparatus 200 includes a substrate 100 and a display panel 210. In this case, the substrate 100 may be used to provide a light source. In some other embodiments, the electronic apparatus 200 may not include the display panel 210 but only include the substrate 100. In this case, the substrate 100 is used to display image information, and electronic elements 120 in all device groups 110 may emit light of different colors.

For example, in a case where the substrate 100 is used to display image information, in each device group 110, a part (one or more) of device groups 110 are used to emit red light, another part (one or more) of device groups 110 are used to emit green light, and yet another part (one or more) of device groups 110 are used to emit blue light. By controlling the luminous intensities of the electronic elements 120 in different device groups 110, different intensities of red light, green light and blue light may be obtained, so that the electronic apparatus 200 may achieve full-color image display.

The embodiments of the present disclosure are described by considering an example of the substrate 100 as a light source of the electronic device 200.

In some examples, as shown in FIGS. 2A and 2B, the substrate 100 further includes a plurality of signal line groups 130. The plurality of signal line groups 130 and the plurality of device groups 110 are located on the same side of the base 101. A signal line group 130 includes a plurality of signal lines 131. The plurality of signal lines 131 all extend in the second direction Y, and the plurality of signal lines 131 are arranged at intervals in the first direction X. Any signal line 131 extends from the bonding region BB to the device region AA, and any signal line 131 is electrically connected to a column of device groups 110 arranged in the second direction Y.

It can be understood that lengths of the plurality of signal lines 131 are not exactly the same. Lengths of a part of the signal lines 131 in the second direction Y are substantially equal to a length of a column of device groups 110 in the second direction Y, and lengths of another part of the signal lines 131 in the second direction Y are less than the length of the column of device groups in the second direction Y.

It can be understood that the plurality of signal line groups 130 and the plurality of device groups 110 are located on the same side of the base 101, so that the signal lines 131 in the signal line groups 130 may be electrically connected to the device groups 110.

In some examples, the plurality of signal line groups 130 are arranged in the same layer, that is, the plurality of signal line groups 130 are arranged in the same conductive layer. It can be understood that, in addition to the plurality of signal line groups 130, other lines (e.g., connection lines 112) may also be provided in the conductive layer.

In some other examples, the signal lines 131 in the plurality of signal line groups 130 may be disposed in different conductive layers. For example, the signal lines 131 in the plurality of signal line groups 130 may be disposed in two conductive layers respectively.

It can be understood that by providing the plurality of signal line groups 130 in different conductive layers, the signal lines 131 may have high wiring flexibility. However, if orthographic projections of two signal lines 131 located in different conductive layers on the base 101 overlap, short circuit may easily occur, affecting the yield of the substrate 100. Moreover, since the substrate 100 includes at least two conductive layers, steps for manufacturing the substrate 100 may increase and the production cost of the substrate 100 may increase.

It can be understood that providing the plurality of signal line groups 130 in the same layer may reduce steps of patterning the conductive layer, thereby simplifying the process for manufacturing the substrate 100, reducing the number of masks, and reducing the cost of the substrate 100. In addition, the occurrence of short circuit and other adverse faults in the substrate 100 may be reduced, thereby improving the yield of the substrate 100.

The embodiments of the present disclosure are described by considering an example where the plurality of signal line groups 130 are disposed in the same layer.

As shown in FIG. 2A, a signal line group 130 includes a plurality of signal lines 131. It can be understood that the signal lines 131 are used to transmit signals such as analog electrical signals or digital electrical signals. In some examples, the plurality of signal line groups 130 may be used to transmit different signals or may be used to transmit the same signal. Each signal line 131 in the signal line group 130 is used to transmit the same signal.

In some examples, the signal lines 131 are made of metal or metal alloy. For example, the materials of the signal lines 131 may include copper or aluminum, and thus the electrical conductivity of the signal lines 131 may be improved.

In some examples, the number of the signal lines 131 included in each signal line group 130 may be the same or different. The distances each between any two adjacent signal lines 131 in a signal line group 130 in the first direction X may be the same or different.

In some examples, the bonding region BB is provided with bonding pins (not shown in the figures) therein. There may be a plurality of bonding pins. The plurality of bonding pins are arranged at intervals in the first direction X. The signal lines 131 are electrically connected to the bonding pins in the bonding region BB.

For example, as shown in FIGS. 2A and 2B, an end of any signal line 131 is electrically connected to a bonding pin in the bonding region BB, another end thereof extends in the second direction Y (or in both the first direction X and the second direction Y) from the bonding region BB to the device region AA, and any signal line 131 is electrically connected to a column of device groups 110 arranged in the second direction Y. It can be understood that the signal line 131 may be directly electrically connected to the electronic element 120 in the device group 110, or may be electrically connected to the electronic element 120 in the device group 110 through other components or conductive patterns.

In some examples, at least one signal line 131 is disposed between two columns of device groups 110 spaced apart in the first direction X, so as to improve utilization rate of an area of the base 101.

In some examples, as shown in FIG. 2A, there is one bonding region BB, and the bonding region BB is provided with a plurality of bonding pins therein. For example, different signal line groups 130 are electrically connected to different bonding pins, so as to reduce mutual interference during signal transmission. The plurality of signal lines 131 in the same signal line group 130 may be electrically connected to a bonding pin, or may be electrically connected to multiple bonding pins.

In some examples, in a case where there is one bonding region BB, the number of the signal lines 131 in the signal line group 130 is the same as the number of columns in which the device groups 110 are arranged. That is, as shown in FIG. 2A, in a case where the plurality of device groups 110 are arranged in three columns in the second direction Y, a signal line group 130 includes three signal lines 131. It can be understood that the three signal lines 131 in the signal line group 130 may be electrically connected to three bonding pins, or may be electrically connected to one bonding pin.

In some other examples, as shown in FIG. 2B, there are a plurality of bonding regions BB, and a plurality of signal lines 131 in a signal line group 130 are electrically connected to a bonding region BB in the plurality of bonding regions BB.

For example, as shown in FIG. 2B, the signal line groups 130 include a first signal line group 130a, a second signal line group 130b, and a third signal line group 130c. The first signal line group 130a includes first signal lines 131a, the second signal line group 130b includes second signal lines 131b, and the third signal line group 130c includes third signal lines 131c.

It will be noted that the first signal line group 130a, the second signal line group 130b and the third signal line group 130c are only used to distinguish the three signal line groups 130 respectively connected to different bonding regions BB, and do not further limit the signal line groups 130. The first signal line 131a, the second signal line 131b and the third signal line group 130c are only used to distinguish the signal lines 131 respectively in the first signal line group 130a, the second signal line group 130b and the third signal line group 130c, and do not further limit the signal lines 131.

In some examples, the first signal line groups 130a, the second signal line groups 130b, and the third signal line groups 130c are used to transmit the same signal.

For example, as shown in FIG. 2B, the bonding region BB includes a first bonding region BB1, a second bonding region BB2 and a third bonding region BB3. It will be noted that the first bonding region BB1, the second bonding region BB2 and the third bonding region BB3 are only used to distinguish three different bonding regions BB, and do not further limit the bonding region BB.

For example, as shown in FIG. 2B, a plurality of first signal lines 131a in the first signal line group 130a are electrically connected to bonding pin(s) in the first bonding region BB1, a plurality of second signal lines 131b in the second signal line group 130b are electrically connected to bonding pin(s) in the second bonding region BB2, and a plurality of third signal lines 131c in the third signal line group 130c are electrically connected to bonding pin(s) in the third bonding region BB3. In this way, a plurality of signal lines 131 in a signal line group 130 may be electrically connected to a bonding region BB in the plurality of bonding regions BB.

Such a provision enables different bonding regions BB to transmit signals to different signal line groups 130, thereby reducing mutual interference during signal transmission and improving the reliability of the substrate 100.

In some examples, as shown in FIG. 2B, signal lines 131 (e.g., first signal lines 131a) in a signal line group 130 (e.g., the first signal line group 130a) are electrically connected to bonding pin(s) in the bonding region BB (e.g., the first bonding region BB1) proximate to the signal line group 130, so as to reduce the lengths of the signal lines 131, reduce voltage drops of the signal lines 131, and improve reliability of signal transmission. In addition, the amount of the material used for the signal lines 131 may also be reduced, thereby reducing the cost of the substrate 100.

In some examples, as shown in FIG. 2A, the substrate 100 further includes first driver chips 103. The first driver chip 103 is electrically connected to at least one device group 110. That is, in some examples, as shown in FIG. 2D, the first driver chip 103 is only electrically connected to one device group 110; and in some other examples, as shown in FIG. 2E, the first driver chip 103 is electrically connected to a plurality of (e.g., four) device groups 110 sequentially arranged in the second direction Y.

It can be understood that a signal line 131 may be electrically connected to the first driver chip 103, or to a device group 110 or multiple device groups 110.

In some examples, multiple device groups 110 arranged in the second direction Y are electrically connected to a first driver chip 103. In some other examples, multiple device groups 110 arranged in the second direction Y are electrically connected to multiple first driver chips 103. For example, in a case where the multiple device groups 110 arranged in the second direction Y are electrically connected to the multiple first driver chips 103, the multiple first driver chips 103 electrically connected to a column of device groups 110 are arranged at intervals in the second direction Y.

Figure 3A:
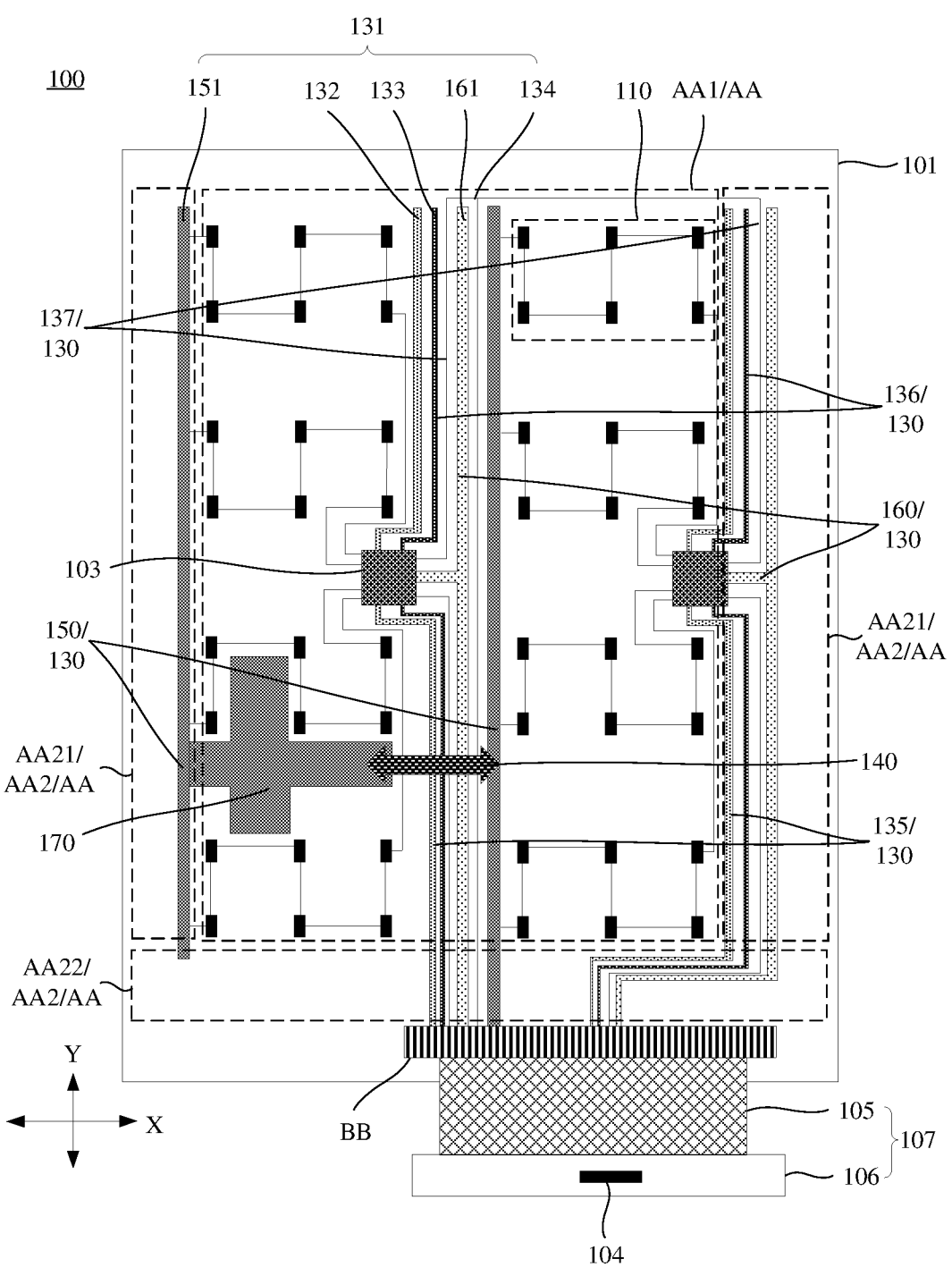
FIG. 3A is a structural diagram of yet another substrate, in accordance with some embodiments.
Figure 3B:
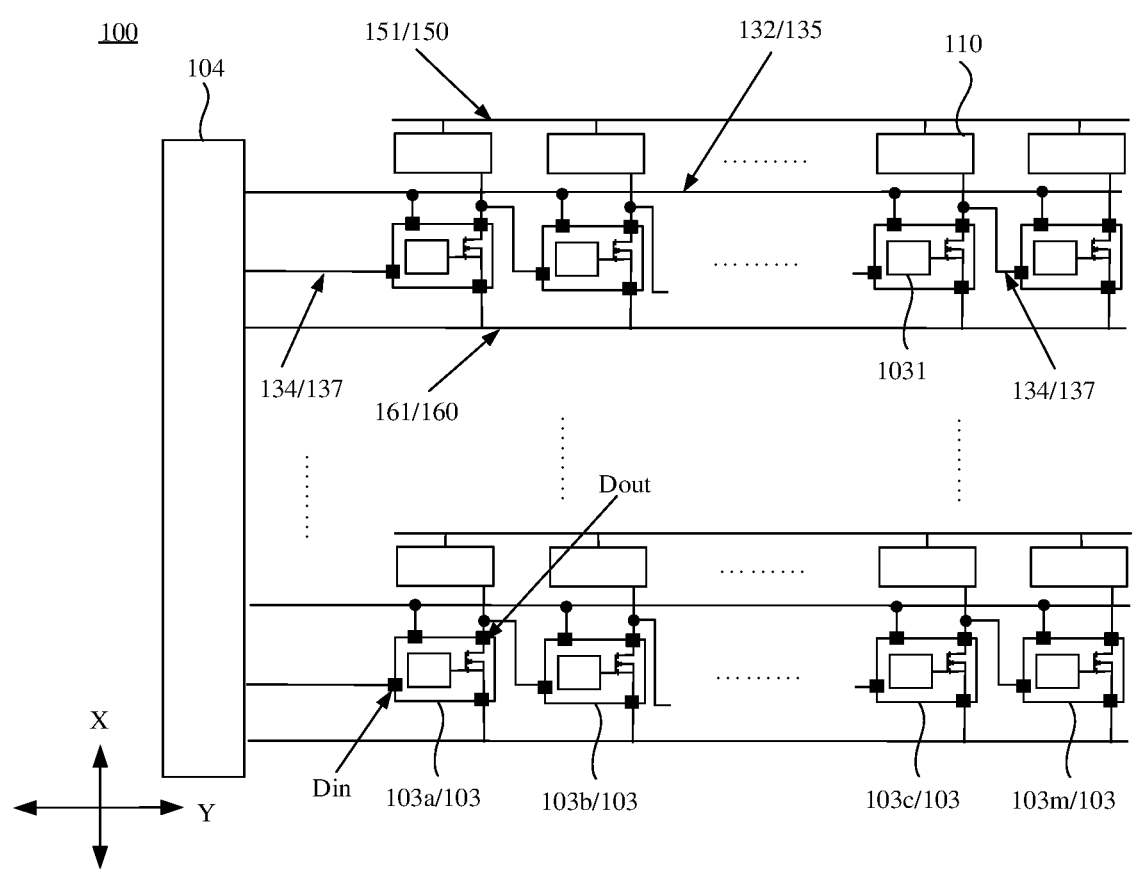
FIG. 3B is a structural diagram of yet another substrate, in accordance with some embodiments.

FIG. 3A is a structural diagram of yet another substrate in accordance with some embodiments. FIG. 3B is a structural diagram of yet another substrate in accordance with some embodiments.

It can be seen from the above that the substrate 100 includes a plurality of signal line groups 130. The signal line groups 130 will be illustrated below with continued reference to FIGS. 3A and 3B.

In some examples, as shown in FIGS. 3A and 3B, the plurality of signal line groups 130 includes a first voltage line group 150, and the first voltage line group 150 includes a plurality of first voltage lines 151. For example, the first voltage line 151 is used to provide power the electronic elements 120 in each device group 110.

For example, as shown in FIGS. 3A and 3B, an end of the first voltage line 151 is electrically connected to a bonding pin in the bonding region BB, another end thereof extends to the device region AA, and the first voltage line 151 is electrically connected to a column of device groups 110 arranged in the second direction Y. That is, the column of device groups 110 arranged in the second direction Y shares the first voltage line 151.

In some examples, as shown in FIG. 3A, the device region AA includes a central region AA1 and an edge region AA2, and the edge region AA2 surrounds the central region AA1. The plurality of device groups 110 are located in the central region AA1, a part (one or more) of the signal lines 131 may be located only in the edge region AA2, and another part (one or more) of the signal lines 131 may be located in both the edge region AA2 and the central region AA1.

For example, as shown in FIG. 3A, a region of the edge region AA2 located between the central region AA1 and the bonding region BB in the second direction Y may be defined as a lower edge region AA22, and two edge regions of the edge region AA2 adjacent to the lower edge region AA22 in the second direction Y and located on both sides of the central region AA1 in the first direction X are defined as side edge regions AA21. That is, the edge region AA2 includes the side edge regions AA21 and the lower edge region AA22. For example, the lower edge region AA22 may also be called a fanout region.

In some examples, as shown in FIG. 3A, a first voltage line 151 in the first voltage line group 150 may be located in the side edge region AA21.

In some examples, as shown in FIG. 3A, the substrate 100 further includes a circuit board 107, and the circuit board 107 is electrically connected to the bonding region BB. For example, as shown in FIG. 3A, the circuit board 107 includes a flexible printed circuit (FPC) 105 and a printed circuit board (PCB) 106. An end of the flexible printed circuit 105 is bonded to the bonding pins in the bonding region BB, and another end thereof is bonded to the printed circuit board 106, so that signals may be transmitted from the plurality of signal line groups 130 to the printed circuit board 106, thereby realizing driving of the plurality of device groups 110.

In some examples, an external power supply of substrate 100 is electrically connected to the first voltage line 151 by the printed circuit board 106 and the bonding pins, so that the power supply may provide power for the electronic elements 120 in a column of device groups 110 through the first voltage line 151.

In some examples, as shown in FIGS. 3A and 3B, the plurality of signal line groups 130 further includes a second voltage line group 160, and the second voltage line group 160 includes a plurality of second voltage lines 161. For example, the second voltage line (a ground line, abbreviated as GND) 161 is used to ground the first driver chip 103.

In some examples, as shown in FIGS. 3A and 3B, an end of the second voltage line 161 is electrically connected to a bonding pin in the bonding region BB, another end thereof extends to the device region AA, and the second voltage line 161 is electrically connected to the first driver chip(s) 103. It can be seen from the above that the first driver chip 103 is electrically connected to the device group(s) 110, so that the second voltage line 161 may be electrically connected to the device group(s) 110 by the first driver chip 103.

In some examples, as shown in FIG. 3A, a second voltage line 161 in the second voltage line group 160 may be located in the side edge region AA21.

In some examples, as shown in FIGS. 3A and 3B, the substrate 100 further includes a second driver chip 104. For example, the second driver chip 104 may be disposed on the printed circuit board 106. For example, the second driver chip 104 is a transmit integrated circuit (Tx IC), and the first driver chip 103 is a receive integrated circuit (Rx IC). The signal sent by the second driver chip 104 is transmitted to the first driver chip 103 through the bonded pin and signal line group 130 (e.g., the second voltage line group 160), thereby realizing driving of the device group 110.

In some examples, an end of the second voltage line 161 is electrically connected to a ground port of the second driver chip 104 by a bonding pin in the bonding region BB, and another end thereof is electrically connected to a ground port of the first driver chip 103, so as to make the first driver chip 103 to be grounded.

In some examples, as shown in FIG. 3B, in a case where a column of device groups 110 arranged in the second direction Y are electrically connected to multiple first driver chips 103, the multiple first driver chips 103 electrically connected to the same column of device groups 110 may share a second voltage line 161.

In some embodiments, as shown in FIGS. 3A and 3B, the plurality of signal line groups 130 further include a power line group 135, and the power line group 135 includes a plurality of power lines 132.

In some examples, the power (abbreviated as Pwr) line 132 is used to provide power for the first driver chip 103. For example, as shown in FIGS. 3A and 3B, an end of the power line 132 is electrically connected to a bonding pin in the bonding region BB, another end thereof extends to the device region AA, and the power line 132 is electrically connected to a power port of the first driver chip 103. It can be seen from the above that the first driver chip 103 is electrically connected to the device group(s) 110, so that the power line 132 may be electrically connected to the device group(s) 110 by the first driver chip 103.

In some examples, as shown in FIG. 3B, in a case where a column of device groups 110 arranged in the second direction Y are electrically connected to multiple first driver chips 103, the multiple first driver chips 103 electrically connected to the same column of device groups 110 may share a power line 132.

In some examples, as shown in FIG. 3A, the plurality of signal line groups 130 further include a data line group 136, and the data line group 136 includes a plurality of data lines 133.

In some examples, the data line 133 is used to transmit a data signal. For example, as shown in FIG. 3A, an end of the data line 133 is electrically connected to a bonding pin in the bonding region BB, another end thereof extends to the device region AA, and the data line 133 is electrically connected to the first driver chip(s) 103. It can be seen from the above that the first driver chip 103 is electrically connected to the device group(s) 110, so that the data line 133 may be electrically connected to the device group(s) 110 by the first driver chip 103.

In some examples, the second driver chip 104 has a first data port to an Nth data port. An end of a data line 133 is electrically connected to the first data port of the second driver chip 104 by a bonding pin and the printed circuit board 106, and another end thereof is electrically connected to data ports of (one or more) first driver chip(s) 103 electrically connected to a column of device groups 110. An end of another data line 133 is electrically connected to the second data port of the second driver chip 104 by a bonding pin and the printed circuit board 106, and another end thereof is electrically connected to data ports of (one or more) first driver chip(s) 103 electrically connected to another column of device groups 110. The rest can be done in the same manner, until the Nth data port. It can be understood that, N is a positive integer. In some examples, the value of N is the same as the number of columns of the device groups 110 arranged in the second direction Y.

In some examples, as shown in FIG. 3B, a first driver chip 103 is electrically connected to a device group 110. For example, multiple first driver chips 103 electrically connected to a column of device groups 110 include a first first driver chip 103*a*, a second first driver chip 103*b*, a third first driver chip 103*c*, up to an mth first driver chip 103*m*. It can be understood that the multiple first driver chips 103 are arranged in cascade.

It will be noted that the first first driver chip 103*a*, the second first driver chip 103*b*, the third first driver chip 103*c*, up to the mth first driver chip 103*m* are only used to distinguish the multiple first driver chips 103 electrically connected to a column of device groups 110, and do not further limit the first driver chips 103.

For example, the first first driver chip 103*a* to the mth first driver chip 103*m* are provided sequentially away from the bonding region BB in the second direction Y. It can be understood that m is greater than 3, and m is a positive integer.

In some examples, as shown in FIGS. 3A and 3B, the plurality of signal line groups 130 further includes an input-output line group 137, and the input-output line group 137 includes input-output lines (also called addressing signal lines) 134.

For example, as shown in FIG. 3B, the first driver chip 103 has an input port Din and an output port Dout. In some examples, as shown in FIG. 3B, there are a plurality of input-output lines 134. An end of an input-output line 134 is electrically connected to an input port of the second driver chip 104 by a bonding pin, and another end thereof is electrically connected to an input port Din of the first first driver chip 103*a*. An end of another input-output line 134 is electrically connected to an output port Dout of the first first driver chip 103*a*, and another end thereof is electrically connected to an input port Din of the second first driver chip 103*b*. An end of yet another input-output line 134 is electrically connected to an output port Dout of the second first driver chip 103*b*, and another end thereof is electrically connected to an input port Din of the third first driver chip 103*c*. The rest can be done in the same manner, until the mth first driver chip 103*m* furthest away from the bonding region BB in the second direction Y.

In some examples, an output terminal Dout of the mth first driver chip 103*m* is electrically connected to a bonding pin in the bonding region BB by an input-output line 134. That is, multiple first driver chips 103 (e.g., the first first driver chip 103*a* to the mth first driver chip 103*m*) electrically connected to a column of device groups 110 are arranged in cascade by the input-output lines 134.

In this way, the signal output by the second driver chip 104 may be transmitted to the multiple first driver chips 103 by the input-output lines 134, and then fed back to the second driver chip 104 by the input-output lines 134, so that the second driver chip 104 may realize driving of the multiple first driver chips 103.

In some examples, as shown in FIG. 3A, the input-output lines 134 surround the second voltage line 161 to save wiring space and improve the utilization rate of the area of the base 101.

In some examples, as shown in FIG. 3B, the first driver chip 103 includes a logic control module 1031. For example, the logic control module 1031 may include a logic circuit. In some examples, the data signal on the input-output line 134 may be input to logic control module 1031 through the input port Din. In some examples, the signal on the power line 132 may be input to the logic control module 1031 through the power port (a port connected to the power line 132) of the first driver chip 103. It can be understood that the logic control module 1031 may drive the electronic elements 120 according to the received signals.

In some examples, substrate 100 further includes an electrostatic loop 108 (referring to FIG. 2A). The electrostatic loop 108 is provided around the plurality of device groups 110 and is electrically connected to the bonding region BB. For example, both ends of the electrostatic loop 108 are electrically connected to the bonding pins in the bonding region BB. In this way, the electrostatic loop 108 may not only surround the plurality of device groups 110, but also surround the plurality of signal line groups 130 electrically connected to the plurality of device groups 110.

It can be understood that the electrostatic loop 108 may play a role of releasing static electricity, thereby protecting the plurality of device groups 110 and the plurality of signal line groups 130 and improving the usage reliability of the substrate 100.

Figure 4A:
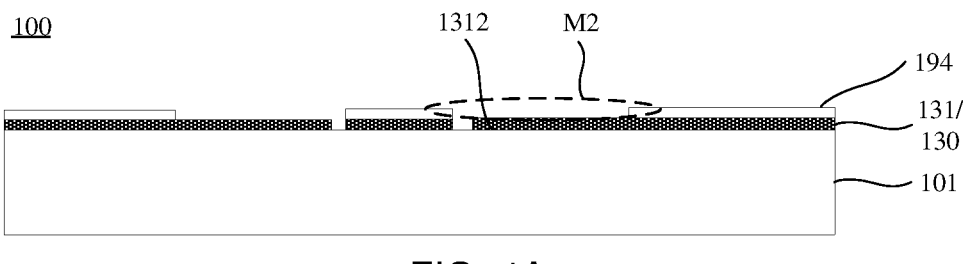
FIG. 4A is a structural diagram of yet another substrate, in accordance with some embodiments.
Figure 4B:
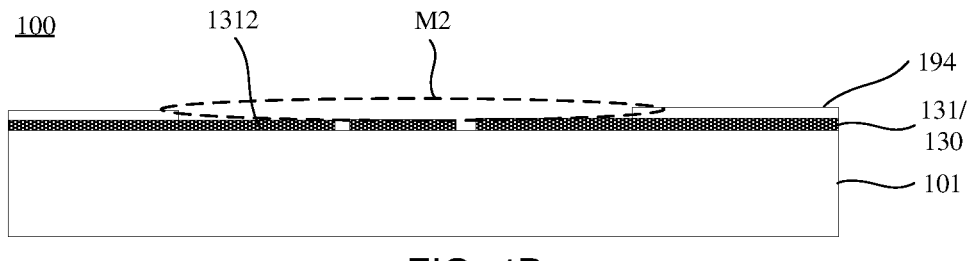
FIG. 4B is a structural diagram of yet another substrate, in accordance with some embodiments.
Figure 4C:
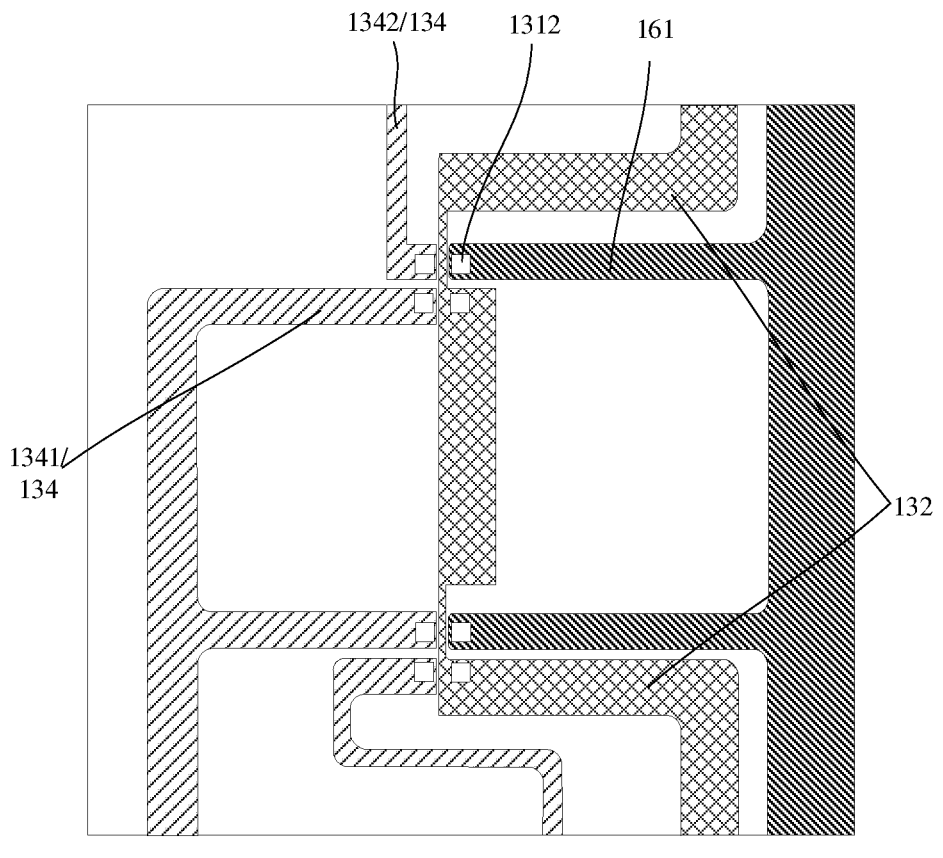
FIG. 4C is a partial structural diagram of a substrate, in accordance with some embodiments.
Figure 4D:
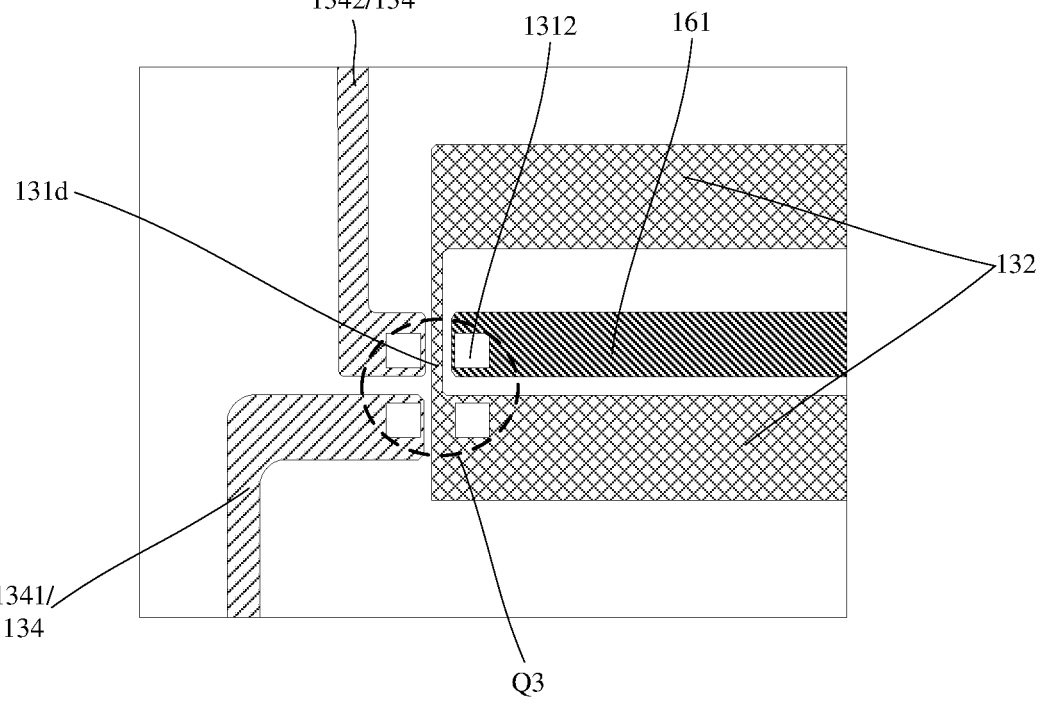
FIG. 4D a partial structural diagram of another substrate, in accordance with some embodiments.

FIG. 4A is a structural diagram of yet another substrate in accordance with some embodiments. FIG. 4B is a structural diagram of yet another substrate in accordance with some embodiments. FIG. 4C is a partial structural diagram of a substrate in accordance with some embodiments. FIG. 4D is a partial structural diagram of another substrate in accordance with some embodiments.

In some embodiments, as shown in FIGS. 4A and 4B, the substrate 100 includes a second reflective layer 194. The second reflective layer 194 is located on a side of the plurality of signal line groups 130 away from the base 101 and covers the plurality of signal line groups 130 (i.e., covering the plurality of signal lines 131). It can be understood that since the connection lines 112 and the plurality of signal line groups 130 are arranged in the same layer, the second reflective layer 194 may also cover the connection lines 112.

For example, the reflective layer 194 is made of an insulation reflective material. As a result, the second reflective layer 194 may play a role of electrical isolation, thereby reducing the risk of short circuit and other faults in the substrate 100. Moreover, the second reflective layer 194 may play a role of reflecting light (e.g., light emitted by the electronic element 120), thereby increasing the brightness of the substrate 100 and reducing the power consumption of the substrate 100.

In addition, providing the second reflective layer 194 to cover the plurality of signal line groups 130 and the plurality of connection lines 112 may also protect the plurality of signal line groups 130 and the plurality of connection lines 112, thereby prolonging the service life of the substrate 100.

In some examples, a material of the second reflective layer 194 includes a white ink. For example, the material of the second reflective layer 194 may include at least one of a photosensitive white ink and a curing white ink.

In some examples, the second reflective layer 194 is provided with first soldered hole(s) M2 therein, and the first soldered hole M2 penetrates the second reflective layer 194 in a direction perpendicular to the base 101 to expose a portion of a signal line 131. For example, as shown in FIGS. 4A and 4B, a portion of the signal line 131 exposed by the first soldered hole M2 may be called a first pad 1312.

In some examples, a signal line 131 may be provided with a plurality of first pads 1312 therein. In some other examples, a signal line 131 may be provided with only one first pad 1312 therein. In still other examples, a signal line 131 may not be provided with a first pad 1312.

It can be seen from the above that the first driver chip 103 may be electrically connected to a plurality of signal lines 131. In some examples, the first driver chip 103 is located on a side of the signal lines 131 away from the base 101. The first driver chip 103 has a plurality of pins, and a pin is soldered to a first pad 1312.

In some examples, the first driver chip 103 may have four pins, so that the first driver chip 103 may be soldered to four first pads 1312. In some other examples, the first driver chip 103 may have six pins, eight pins, or twelve pins, etc. The embodiments of the present disclosure do not limit the number of the pins of the first driver chip 103.

In some examples, as shown in FIGS. 4C and 4D, the input-output lines 134 include input lines 1341 and output lines 1342. The four pins of the first driver chip 103 are respectively soldered to a first pad 1312 in an input line 1341, a first pad 1312 in an output line 1342, a first pad 1312 in the second voltage line 161, and a first pad 1312 in the power line 132.

In some examples, a first soldered hole M2 may expose a plurality of (e.g., four) first pads 1312 soldered to the first driver chip 103. In some other examples, the plurality of (e.g., four) first pads 1312 soldered to the first driver chip 103 are respectively exposed by a plurality of first soldered holes M2.

In some examples, a size of the first pad 1312 is directly related to a size of a pin of the first driver chip 103. That is, the larger the size of the pin of the first driver chip 103, the larger the area of the orthographic projection of the first pad 1312 on the base 101. As a result, the pin of the first driver chip 103 may be soldered to the first pad 1312.

In some examples, areas of the orthographic projections of the plurality of first pad 1312 on the base 101 may be the same or different.

In some examples, a ratio of an area of the orthographic projection of the pin of the first driver chip 103 on the base 101 to an area of the orthographic projection of the first pad 1312 soldered to the pin of the first driver chip 103 on the base 101 is in a range of 0.8 to 2, inclusive.

In some examples, the area of the orthographic projection of the pin of the first driver chip 103 on the base 101 may be less than the area of the orthographic projection of the first pad 1312 soldered to the pin of the first driver chip 103 on the base 101, so as to improve the convenience of soldering of the pin of the first driver chip 103 and the first pad 1312.

For example, the ratio of the area of the orthographic projection of the pin of the first driver chip 103 on the base 101 to the area of the orthographic projection of the first pad 1312 soldered to the pin of the first driver chip 103 on the base 101 may be 0.9, 1.0, 1.5 or 1.8.

Figure 6F:
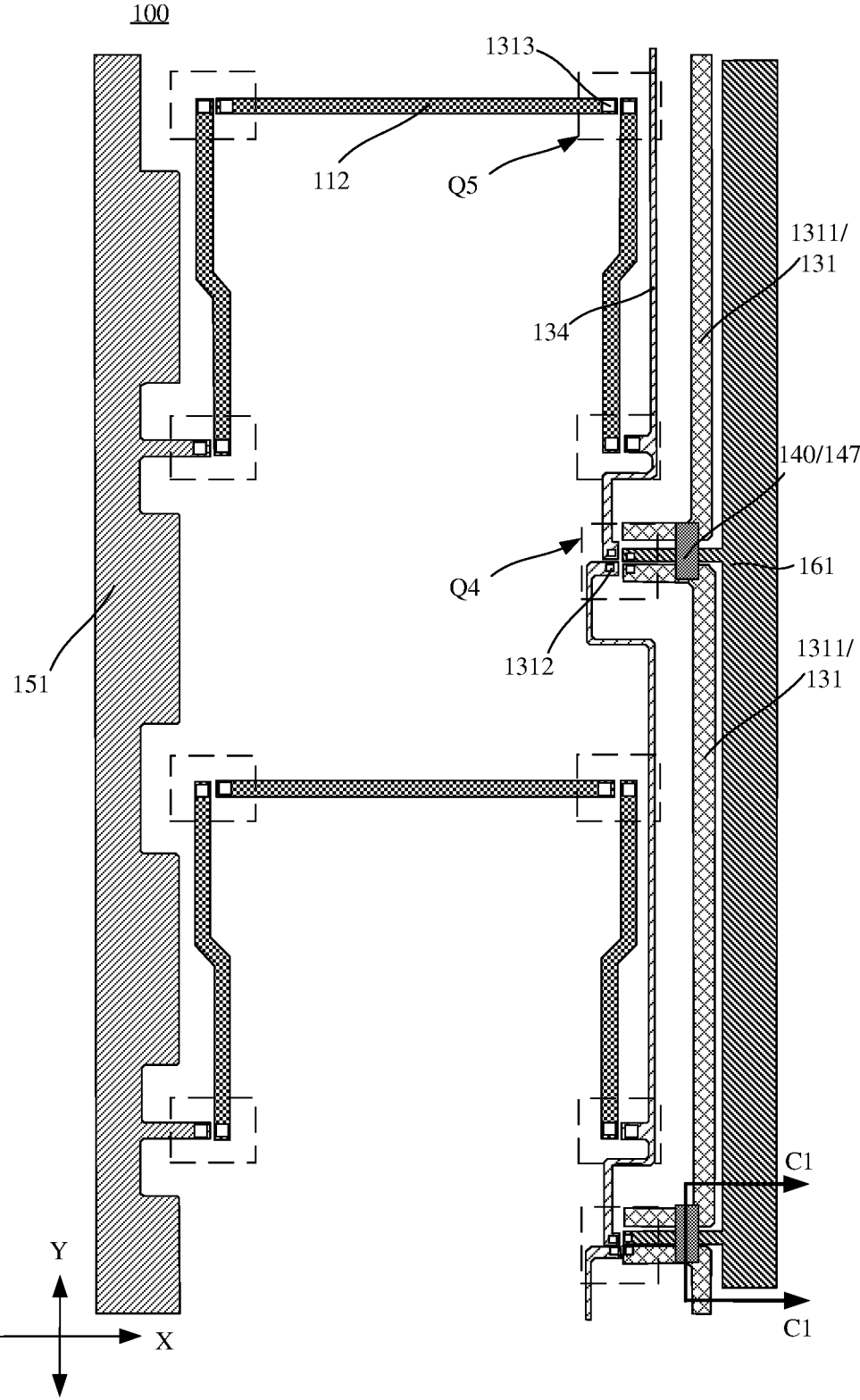
FIG. 6F is a structural diagram of yet another substrate, in accordance with some embodiments.
Figure 6G:
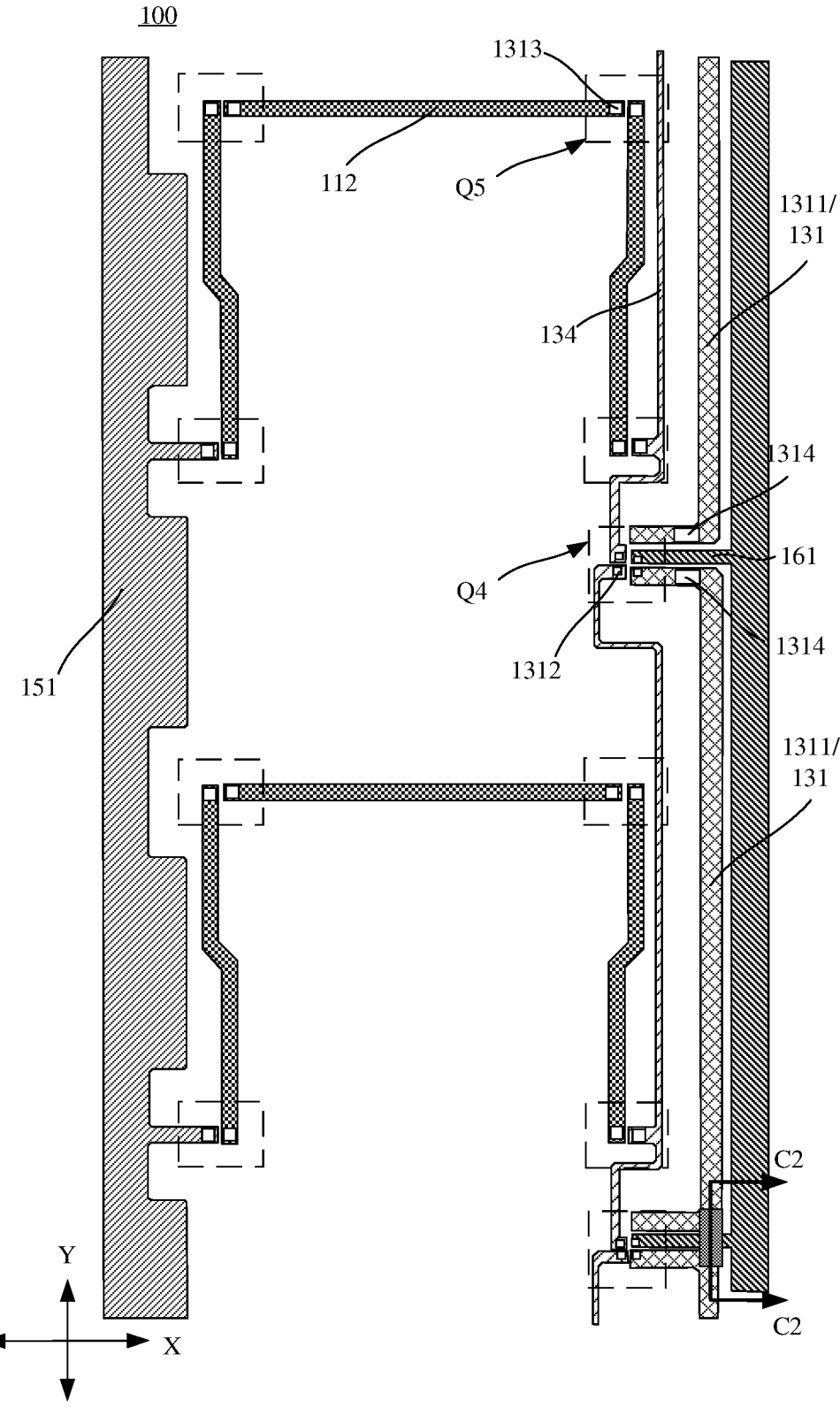
FIG. 6G is a structural diagram of yet another substrate, in accordance with some embodiments.
Figure 7A:
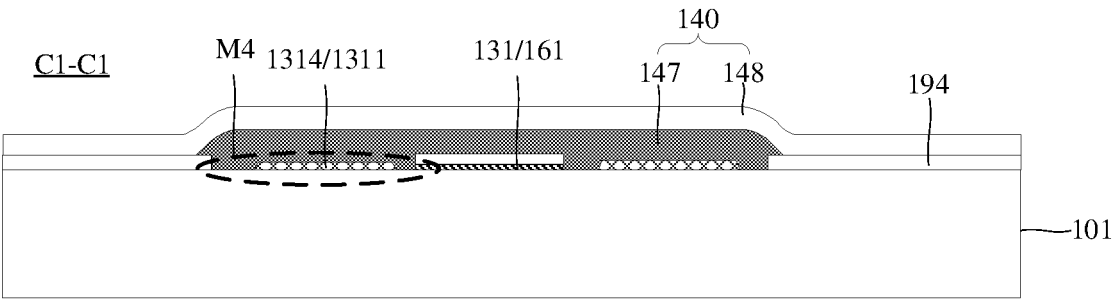
FIG. 7A is a sectional view taken along a C1-C1 direction in FIG. 6F.
Figure 7B:
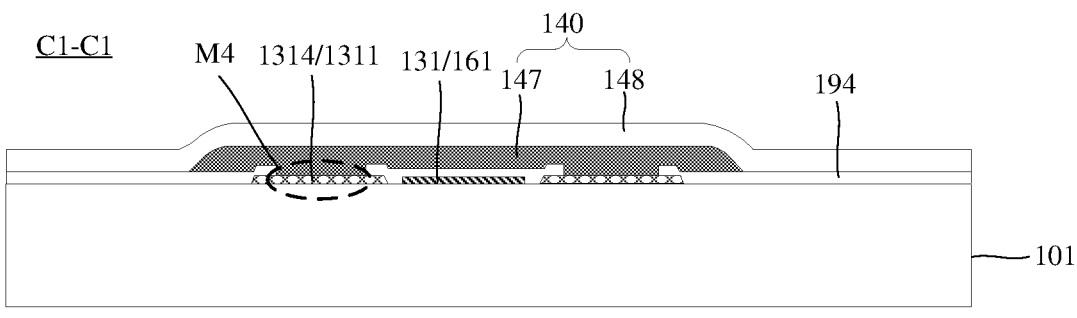
FIG. 7B is another sectional view taken along a C1-C1 direction in FIG. 6F.
Figure 7C:
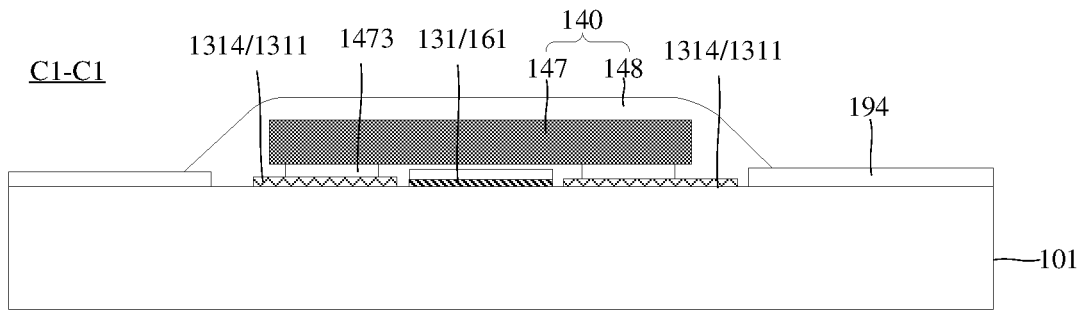
FIG. 7C is yet another sectional view taken along a C1-C1 direction in FIG. 6F.
Figure 7D:
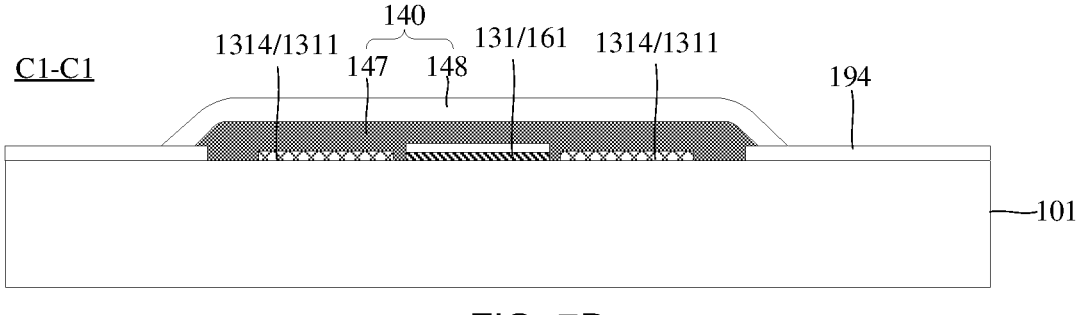
FIG. 7D is yet another sectional view taken along a C1-C1 direction in FIG. 6F.
Figure 7E:
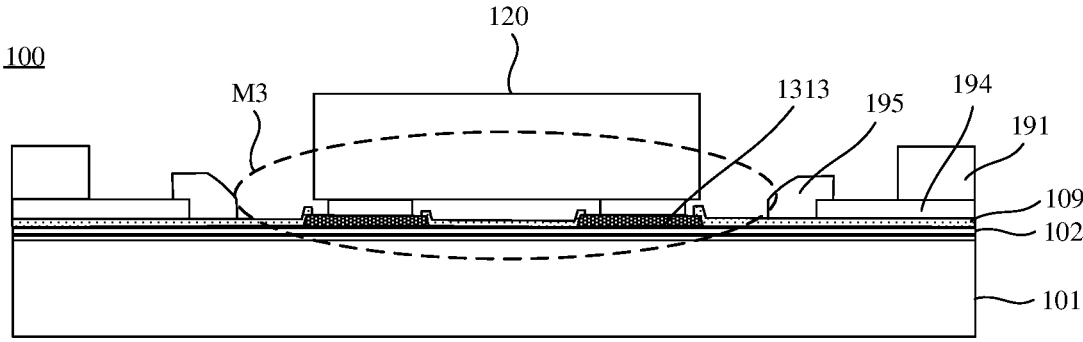
FIG. 7E is a structural diagram of yet another substrate, in accordance with some embodiments.

In some examples, the second reflective layer 194 is further provided with a second soldered hole M3 therein (referring to FIG. 7E). The second soldered hole M3 penetrates the second reflective layer 194 in a direction perpendicular to the base 101 to expose a portion of the connection line 112. For example, a portion of the connection line 112 exposed by the second soldered hole M3 may be called a second pad 1313 (referring to FIGS. 6F and 6G).

In some examples, the electronic element 120 includes two pins, where one pin is soldered to a second pad 1313 in a connection line 112 and the other pin is soldered to a second pad 1313 in another connection line 112. In this way, the plurality of electronic elements 120 may be connected in series by a plurality of connection lines 112.

In some examples, a second soldering hole M3 may expose two second pads 1313 soldered to the electronic element 120. In some other examples, the two second pads 1313 soldered to the electronic element 120 are respectively exposed by two second soldering holes M3.

In some examples, a size of the second pad 1313 is directly related to a size of the pin of the electronic element 120. That is, the larger the size of the pin of the electronic element 120, the larger the area of the orthographic projection of the second pad 1313 on the base 101. As a result, the pin of the electronic element 120 may be soldered to the second pad 1313.

In some examples, areas of the orthographic projections of the plurality of second pad 1313 on the base 101 may be the same or different.

In some examples, a ratio of an area of the orthographic projection of the pin of the electronic element 120 on the base 101 to an area of the orthographic projection of the second pad 1313 soldered to the pin of the electronic element 120 on the base 101 is in a range of 0.8 to 2, inclusive.

In some examples, the area of the orthographic projection of the pin of the electronic element 120 on the base 101 may be less than the area of the orthographic projection of the second pad 1313 soldered to the pin of the electronic element 120 on the base 101, so as to improve the convenience of soldering of the pin of the electronic element 120 and the second pad 1313.

For example, the ratio of the area of the orthographic projection of the pin of the electronic element 120 on the base 101 to the area of the orthographic projection of the second pad 1313 soldered to the pin of the electronic element 120 on the base 101 may be 0.9, 1.0, 1.5 or 1.8.

The method for manufacturing the substrate 100 will be exemplarity described below.

In some examples, the base 101 is made of glass. For example, a magnetron sputter process may be used to form a buffer layer 102 on a side of the base 101 (referring to FIG. 7E). For example, the buffer layer may be a passivation layer (a PVX layer).

A conductive layer is formed on a side of the buffer layer 102 away from the base 101. For example, the material of the conductive layer includes copper. In some examples, a magnetron sputtering process may be used to form the conductive layer on a side of the buffer layer 102 away from the base 101. In some other examples, an electroplating process may be used to form the conductive layer on a side of the buffer layer 102 away from the base 101. In yet other examples, both the magnetron sputtering process and the electroplating process may be used to form the conductive layer on a side of the buffer layer 102 away from the base 101.

The conductive layer is patterned by cleaning, coating, baking, photo, development, hard baking, etching, stripping and other processes to form the plurality of signal line groups 130 and the plurality of connection lines 112.

A passivation layer 109 (referring to FIG. 7E) is formed on a side of the patterned conductive layer away from the base 101. It can be understood that the material of the passivation layer 109 includes an insulating material, which not only plays a role of protecting the conductive layer but also plays a role of electrical isolation. It can be understood that the passivation layer 109 may expose the pads (including the first pads 1312, the second pads 1313, and the like).

A second reflective layer 194 is formed on a side of the passivation layer 109 away from the base 101. The second reflective layer 194 may cover the conductive layer (i.e., cover the plurality of signal line groups 130 and the plurality of connection lines 112), so as to play a role of electrical isolation and reflecting light.

In some examples, a print process, a 3D printing process, an exposure and development process (e.g., laser direct imaging (LDI) exposure) or the like may be used to directly form the patterned second reflective layer 194 on a side of the passivation layer 109 away from the base 101, so that the first soldered hole M2 may expose the first pad 1312 and the second soldered hole M3 may expose the second pad 1313, thereby simplifying the process for manufacturing the substrate 100 and reducing the cost of the substrate 100.

In some other examples, a photoresist layer may be formed on a side of the second reflective layer 194 away from the conductive layer by coating, photo, development and other processes. The photoresist layer is patterned by an etching process to expose portions of the second reflective layer 194 where openings (including the first soldered hole M2 and the second soldered hole M3) are required. The exposed portions of the second reflective layer 194 are removed using an etching process to form the first soldered hole M2 and the second soldered hole M3, so that the first soldered hole M2 may expose the first pad 1312 and the second soldered hole M3 may expose the second pad 1313.

Figure 4E:
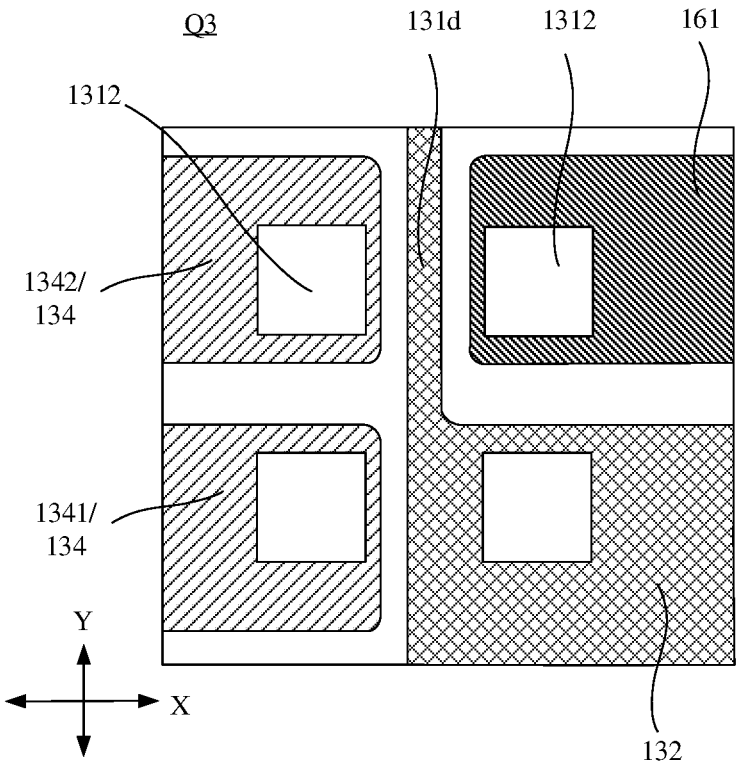
FIG. 4E is a partial enlarged view of a Q3 region in FIG. 4D.

FIG. 4E is a partial enlarged view of a Q3 region in FIG. 4D.

It is found by inventors of the present disclosure that the above implementation has the following technical problems.

It can be seen from the above that a part (one or more) of the signal lines 131 need to be electrically connected to a plurality of first driver chips 103 arranged in the second direction Y. Taking the power line 132 as an example, as shown in FIGS. 4D and 4E, a part of line segments (e.g., a first line segment 131d shown in FIGS. 4D and 4E) of the power line 132 needs to be provided between two adjacent first pads 1312 in the first direction X.

It can be understood that since the first line segment 131d is located between the two adjacent first pads 1312, the width of the first line segment 131d (e.g., the width in the first direction X) is caused to be small, thereby increasing the risk of breakage of the first line segment 131d, affecting the value of the current that the first line segment 131d can carry, causing an increase in the heat dissipation of the first line segment 131d, and reducing the reliability of the substrate 100.

Figure 5A:
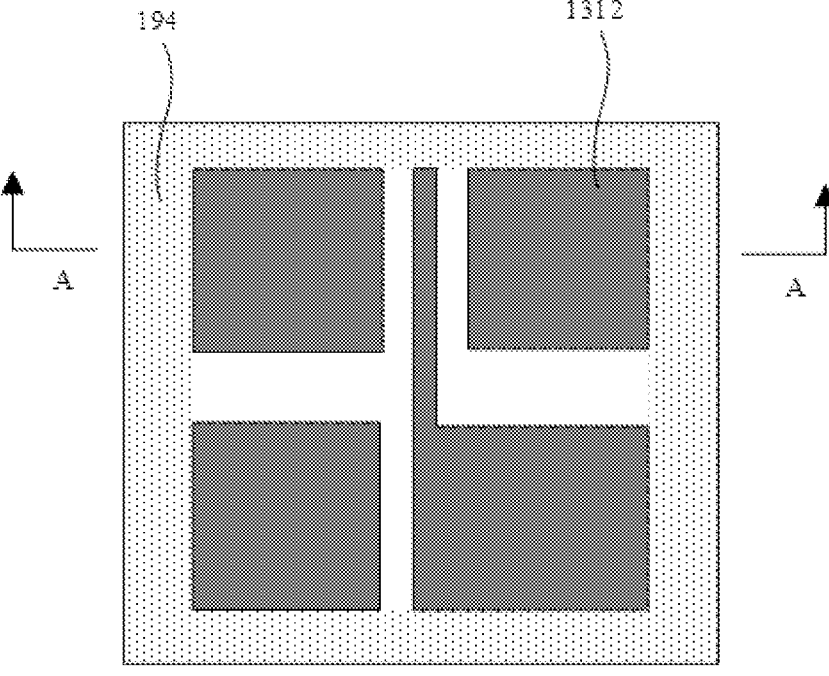
FIG. 5A is a diagram of a position relationship between a first line segment and a second reflective layer, in accordance with some embodiments.
Figure 5B:
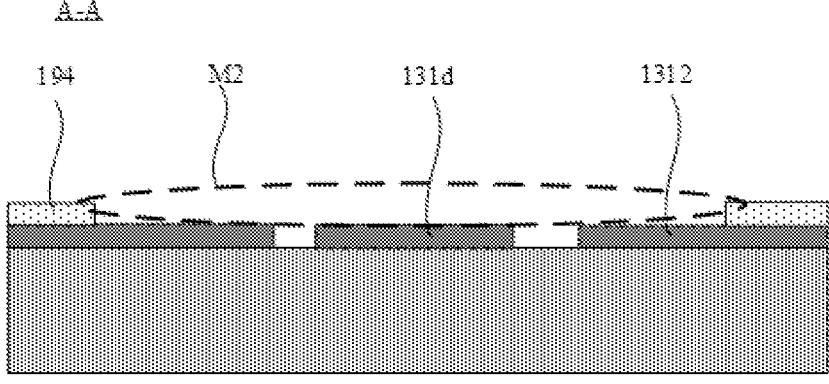
FIG. 5B is a sectional view taken along an A-A' direction in FIG. 5A.
Figure 5C:
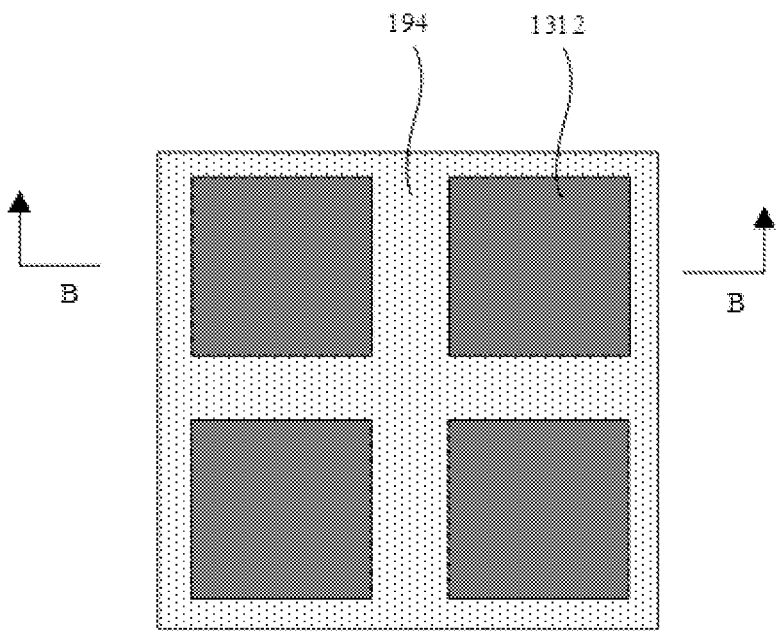
FIG. 5C is a diagram of another position relationship between a first line segment and a second reflective layer, in accordance with some embodiments.
Figure 5D:
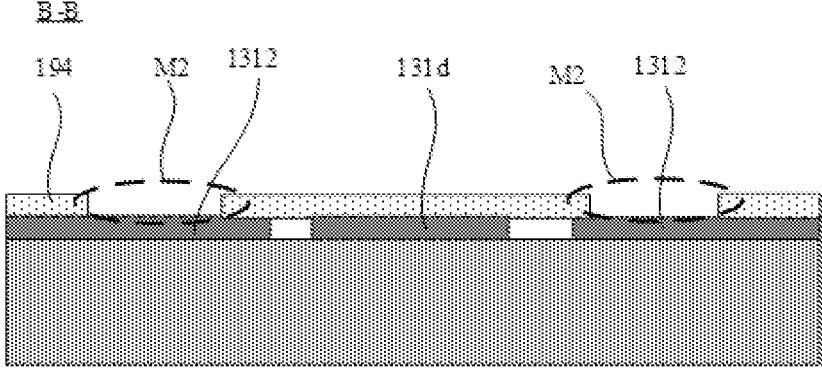
FIG. 5D is a sectional view taken along a B-B' direction in FIG. 5C.

FIG. 5A is a diagram of a position relationship between the first line segment and the second reflective layer in accordance with some embodiments. FIG. 5B is a sectional view taken along an A-A' direction in FIG. 5A. FIG. 5C is a diagram of another position relationship between the first line segment and the second reflective layer in accordance with some embodiments. FIG. 5D is a sectional view taken along a B-B' direction in FIG. 5C.

In some examples, as shown in FIGS. 5A and 5B, in a case where a print process, a 3D printing process, or an exposure and development process is used to form the first soldered hole M2, a first soldered hole M2 may expose multiple (e.g., four) first pads 1312. It can be understood that the first line segment 131d is located between two adjacent first pads 1312, so that the first line segment 131d may also be exposed by the first soldered hole M2.

The two adjacent first pads 1312 each and the first line segment 131d located between the two adjacent first pads 1312 have a small distance therebetween, and the first pads 1312 and the first line segment 131d are exposed by the first soldered hole M2. Therefore, when the first driver chip 103 is soldered to the first pad 1312, the solder (such as soldering tin) may easily fall into a region between the first pad 1312 and the first line segment 131d, resulting in short circuit between the first pad 1312 and the first line segment 131d.

In some other examples, as shown in FIGS. 5C and 5D, the second reflective layer 194 may be formed first, and then photolithography and other processes are used to pattern the second reflective layer 194 to form the first soldered hole M2, so that the first soldered hole M2 may only expose a first pad 1312, that is, the second reflective layer 194 may cover the first line segment 131d located between the two adjacent first pads 1312, thereby reducing the risk of short circuit between the first line segment 131d and the first pad 1312 caused by the solder.

However, using the photolithography process requires the use of the mask, so that the process is complex and the cost of the substrate 100 increases. In addition, the thickness of the second reflective layer 194 is about in a range of 50 μm to 60 μm (e.g., 55 μm), and the height of the soldering pins of the first driver chip 103 is about 15 μm or even less (e.g., 8 μm). In this way, providing the second reflective layer 194 to cover the first line segment 131d may increase the difficulty of the pins of the first driver chip 103 soldered to the first pads 1312, causing poor contact of the substrate 100 and affecting the reliability of the substrate 100.

In addition, in a case where the distance between two adjacent first pads 1312 is small, even if a first soldered hole M2 only exposes a first pad 1312, the first line segment 131d cannot be provided between the two adjacent first pads 1312, which increases the wiring difficulty of the substrate 100.

For example, by considering an example where the distance between two adjacent first pads 1312 is 70 μm and the width of the first line segment 131d is 30 μm, in a case where the first line segment 131d is located at a middle between the two adjacent first pads 1312, the distance between the first line segment 131d and the first pad 1312 is 20 μm. In conventional design, the distance between the first line segment 131d and the first pad 1312 needs to be greater than or equal to 42 μm.

That is, in a case where the distance between the two adjacent first pads 1312 is small, even if the second reflective layer 194 is provided to cover the first line segment 131d, the solder may also cause short circuit between the first line segment 131d and the first pad 1312 during soldering, thereby reducing the yield of the substrate 100.

Moreover, considering an example of the size of the substrate 100 as 34 inches (e.g., the substrate 100 is square and a diagonal length is 34 inches), a plurality of signal line groups 130 are located in the same conductive layer, resulting in large lengths of the signal lines 131 and an increase in risk of breakage of the signal lines 131.

Figure 6A:
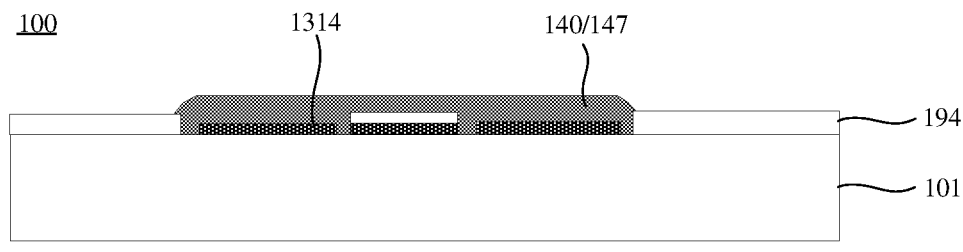
FIG. 6A is a structural diagram of yet another substrate, in accordance with some embodiments.
Figure 6B:
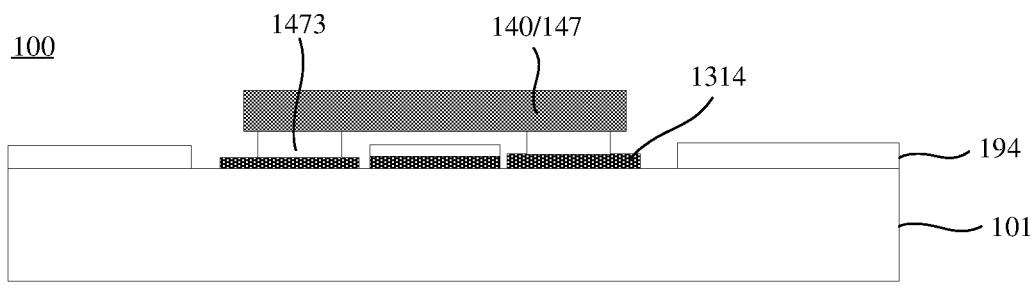
FIG. 6B is a structural diagram of yet another substrate, in accordance with some embodiments.
Figure 6C:
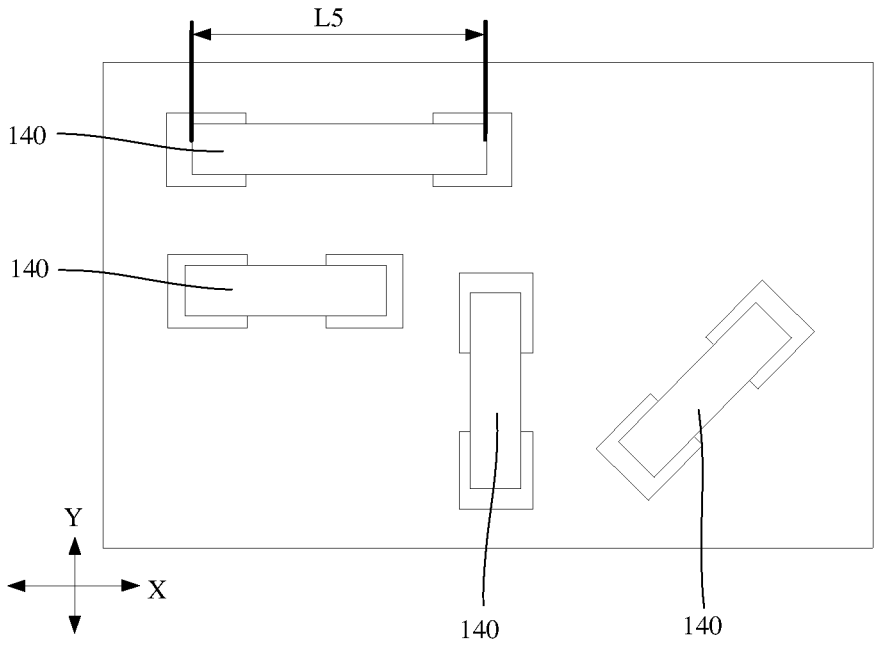
FIG. 6C is a structural diagram of a bridging portion, in accordance with some embodiments.
Figure 6D:
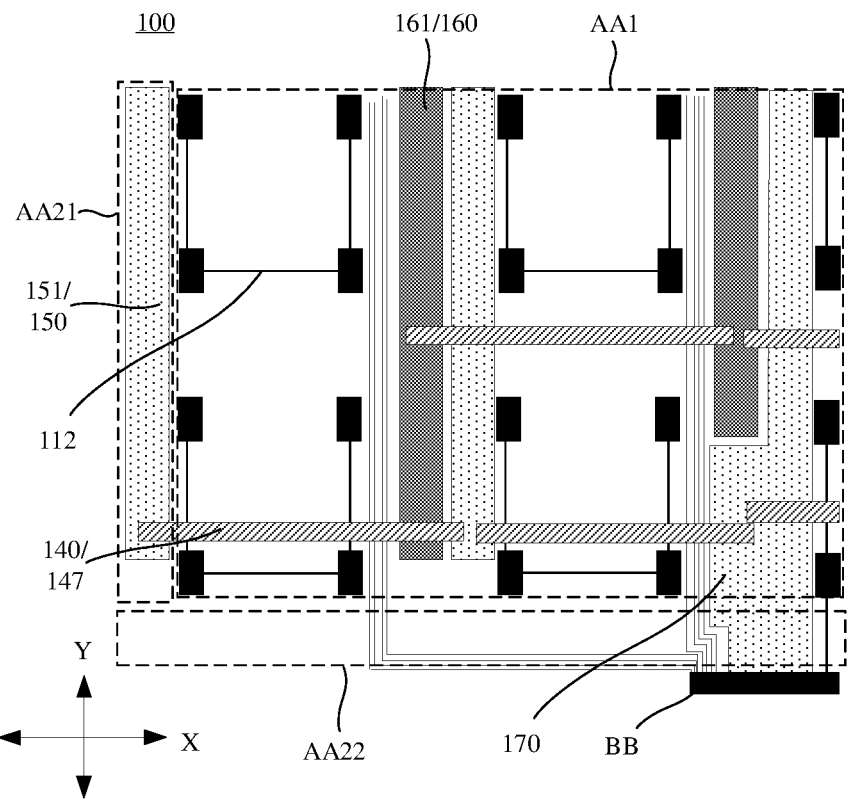
FIG. 6D is a partial structural diagram of yet another substrate, in accordance with some embodiments.
Figure 6E:
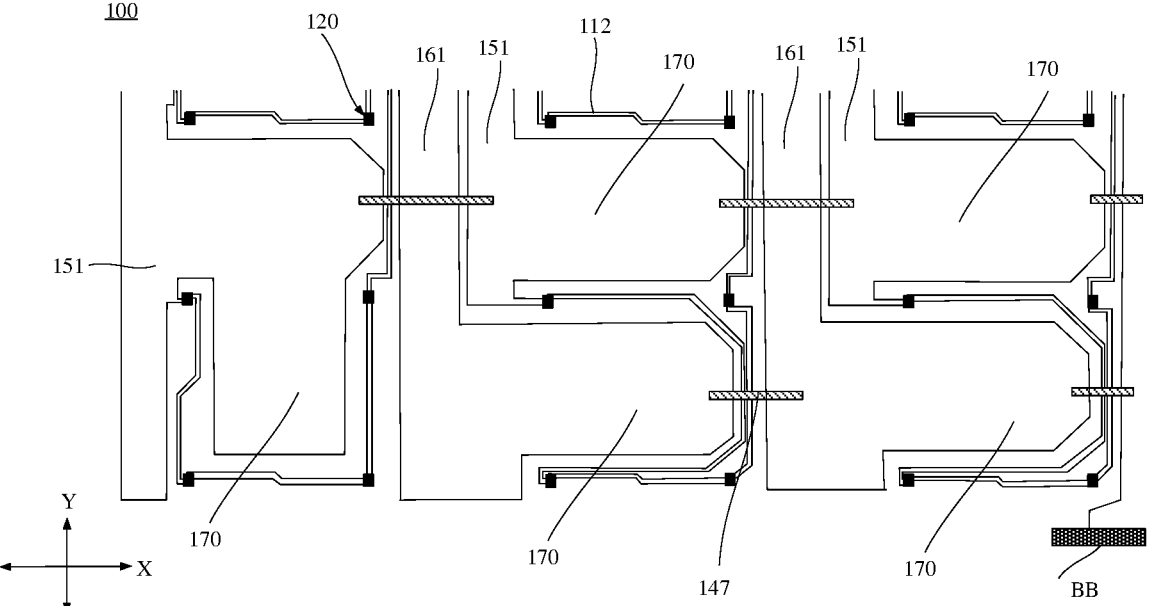
FIG. 6E is a partial structural diagram of yet another substrate, in accordance with some embodiments.

FIG. 6A is a structural diagram of yet another substrate in accordance with some embodiments. FIG. 6B is a structural diagram of yet another substrate in accordance with some embodiments. FIG. 6C is a structural diagram of a bridging portion in accordance with some embodiments. FIG. 6D is a partial structural diagram of yet another substrate in accordance with some embodiments. FIG. 6E is a partial structural diagram of yet another substrate in accordance with some embodiments. FIG. 6F is a structural diagram of yet another substrate in accordance with some embodiments. FIG. 6G is a structural diagram of yet another substrate in accordance with some embodiments.

In light of this, in some embodiments, as shown in FIGS. 6A and 6B, the substrate 100 further includes a plurality of bridging portions 140. The plurality of bridging portions 140 and the plurality of device groups 110 are located on the same side of the base 101, and at least one bridging portion 140 is located in the device region AA. The bridging portion 140 includes a conductive portion 147.

It can be seen from the above that the plurality of signal line groups 130 and the plurality of device groups 110 are located on the same side of the base 101. The plurality of bridging portions 140 and the plurality of device groups 110 are located on the same side of the base 101. In this way, the plurality of bridging portions 140, the plurality of signal line groups 130 and the plurality of device groups 110 are located on the same side of the base 101.

It can be understood that the second reflective layer 194 covers the plurality of signal line groups 130, and a portion of the bridging portion 140 is located on a side of the second reflective layer 194 away from the base 101.

In some examples, some (one or more) of the plurality of bridging portions 140 are located in the device region AA, and the other (one or more) of the plurality of bridging portions 140 are located in the bonding region BB. In some other examples, the plurality of bridging portions 140 are all located in the device region AA. In some examples, a bridging portion 140 may be located in both the device region AA and the bonding region BB.

In some examples, as shown in FIG. 6C, the bridging portions 140 may extend in the first direction X, or extend in the second direction Y, or extend in a direction intersecting the first direction X (or the second direction Y). For example, an acute angle between an extension direction of the bridging portion 140 and the first direction X (or the second direction Y) may be greater than 0° and less than 90°. It can be understood that extension directions of the plurality of bridging portions 140 may be the same or different.

In some examples, as shown in FIG. 6C, a length L5 of the bridging portion 140 is in a range of 1 mm to 30 mm, inclusive. For example, the length L5 of the bridging portion 140 may be in a range of 5 mm to 25 mm, inclusive; in a range of 10 mm to 20 mm, inclusive; or in a range of 13 mm to 18 mm, inclusive. For example, the length L5 of the bridging portion 140 may be 5 mm, 10 mm, 15 mm, 20 mm or 25 mm. The lengths L5 of the plurality of bridging portions 140 may be the same or different.

As shown in FIGS. 6A and 6B, the bridging portion 140 includes conductive portions 147. It can be understood that the conductive portion 147 may play a role of electric conduction. In some examples, as shown in FIG. 6A, the conductive portion 147 is made of a conductive material, such as copper or aluminum. In some other examples, as shown in FIG. 6B, the conductive portion 147 may be a resistor or a capacitor.

It can be understood that, as shown in FIG. 6B, by considering an example where the conductive portion 147 is a resistor, the resistor may include a soldering portion 1473. In some examples, the soldering portion 1473 includes a pin of the resistor. In some other examples, in addition to the pin of the resistor, the soldering portion 1473 further includes solder (e.g., soldering tin) added on the pin of the resistor. In still other examples, the soldering portion 1473 may only include solder. For example, the number of the soldering portions 1473 may be two, and the two soldering portions 1473 are soldered to two third pads 1314, respectively.

It can be understood that the conductive portions 147 of the plurality of bridging portions 140 may be the same or different.

At least one bridging portion 140 is located in the device region AA, so that at least one conductive portion 147 may be located in the device region AA, and thus the conductive portion 147 may be electrically connected to the signal line 131.

In some examples, as shown in FIG. 6D, at least two signal lines 131 in at least one signal line group 130 are electrically connected by a conductive portion 147.

It can be understood that after at least two signal lines 131 in a signal line group 130 are electrically connected by the conductive portion 147, the voltage drop of the signal lines 131 may be reduced, thereby being conducive to reducing the widths of the signal lines 131 in the first direction X. It can be seen from the above that, as shown in FIG. 6D, the signal line 131 may be located in the side edge region AA21. Therefore, a signal line 131 located in the side edge region AA21 in a signal line group 130 is electrically connected to another signal line 131 in the signal line group 130 by the conductive portion 147, which is beneficial to reducing the width of the signal line 131 located in the side edge region AA21. Therefore, the width of the side edge region AA21 may be reduced, which is beneficial to realizing a narrow frame of the substrate 100.

Moreover, after at least two signal lines 131 in a signal line group 130 are electrically connected by the conductive portion 147, the voltage drop of the signal lines 131 is reduced, which is also conducive to reducing the thicknesses of the signal lines 131, reducing the amount of the material used for the signal lines 131, and reducing the cost of the substrate 100.

It can be seen from the above that, in some examples, some (one or more) of the signal lines 131 need to extend in the first direction X in the lower edge region AA22 before extending to the central region AA1 in the second direction Y to be electrically connected to the device group 110.

In some examples, as shown in FIG. 6D, at least one conductive portion 147 is located in the central region AA1, and at least two signal lines 131 in a signal line group 130 may be electrically connected in the central region AA1 by the conductive portion 147. In this way, the electrically connected signal lines 131 may be electrically connected to the bonding pin in the bonding region BB together. Therefore, the signal lines 131 do not need to extend in the first direction X in the lower edge region AA22, and thus an occupied space of the signal lines 131 in the lower edge region AA22 is reduced, which is beneficial for reducing the width of the lower edge region AA22 and achieving the narrow frame of substrate 100. Moreover, the convenience of the plurality of signal lines 131 being electrically connected to the bonding pins may be improved, thereby improving the wiring convenience of the substrate 100.

In some examples, as shown in FIG. 6D, the conductive portion 147 electrically connecting at least two signal lines 131 is located between two adjacent device groups 110 in the second direction Y. Such a provision allows the conductive portion 147 to be located outside the region where the device group 110 is located, thereby reducing the influence of the conductive portion 147 on the light emission of the electronic elements 120 in the device group 110 and improving the reliability of the substrate 100.

It can be understood that the device group 110 includes a plurality of electronic elements 120, and the region where the device group 110 is located refers to an enclosed virtual region formed by sequentially connecting edges of the electronic elements 120 located on the outermost side of the device group 110 in a clockwise or counterclockwise manner. In some examples, in a case where the plurality of electronic elements 120 in the device group 110 are arranged in a matrix, the region where the device group 110 is located is rectangular, and the plurality of electronic elements 120 in the device group 110 are all located within the rectangular region.

In some other examples, the conductive portion 147 electrically connecting at least two signal lines 131 and the region where the device group 110 is located may have overlap, thereby improving the wiring flexibility of the substrate 100.

That is, the provision of at least two signal lines 131 in at least one signal line group 130 to be electrically connected by the conductive portion 147 may be beneficial to reducing the width of the signal lines 131 in the first direction X, thereby being beneficial to reducing the width of the side frame of the substrate 100. Moreover, at least two signal lines 131 in a signal line group 130 may be electrically connected in the central region AA1, so that when being electrically connected to the bonding region BB, the signal lines 131 do not need to extend in the first direction X in the lower edge region AA22, thereby being beneficial to reducing the width of the lower edge region AA22 and thus beneficial to reducing the width of the lower frame of the substrate 100. In addition, the provision of at least two signal lines 131 in at least one signal line group 130 to be electrically connected by the conductive portion 147 may also be conducive to reducing the thicknesses of the signal lines 131, thereby reducing the amount of the material used for the signal lines 131 and reducing the cost of the substrate 100.

It can be seen from the above that, the plurality of signal line groups 130 include the first voltage line group 150 and the second voltage line group 160. In some examples, as shown in FIG. 6D, at least two first voltage lines 151 in the first voltage line group 150 may be electrically connected by a conductive portion 147, and at least two second voltage lines 161 in the second voltage line group 160 may also be electrically connected by another conductive portion 147. In some other examples, in addition to the first voltage line group 150 and the second voltage line group 160, at least two signal lines 131 (e.g., power lines 132 or input-output lines 134) in another signal line group 130 (e.g., the power line group 135 or the input-output line group 137) may also be provided to be electrically connected by a conductive portion 147.

In some examples, as shown in FIG. 6D, considering an example of the first voltage line 151 located in the side edge region AA21, the first voltage line 151 located in the side edge region AA21 is electrically connected to another first voltage line 151 in the first voltage line group 150 by the conductive portion 147, so that the width of the first voltage line 151 located in the side edge region AA21 in the first direction X may be reduced to a range of 0.5 mm to 10 mm, inclusive. For example, the width of the first voltage line 151 in the first direction X may be 0.5 mm, 1 mm, 5 mm, or 6.412 mm.

It can be seen from the above that as shown in FIG. 6E, a plurality of electronic elements 120 in the device group 110 are electrically connected by the connection lines 112. In some examples, as shown in FIG. 6F, a plurality of connection lines 112 in the device group 110 are arranged at intervals. A pin of the electronic element 120 is soldered to a second pad 1313 in a connection line 112, and another pin thereof is soldered to a second pad 1313 in another connection line 112. In this way, after being soldered to the connection line 112, the electronic element 120 may be located in the Q5 region (referring to FIG. 6E for a diagram of the positional relationship between the electronic element 120 and the connection line 112 after solder). Similarly, as shown in FIG. 6F, after being soldered to the first pads 1312, the first driver chip 103 may be located in the Q4 region.

In some examples, as shown in FIGS. 6D and 6E, the substrate 100 further includes conductive patterns 170, and the conductive patterns 170 are provided in the same layer as the plurality of signal line groups 130 and the plurality of connection lines 112. In some examples, the plurality of signal line groups 130, the plurality of connection lines 112 and the plurality of conductive patterns 170 are in the same layer and made of the same material.

It can be understood that the "same layer" refers to that a whole layer structure is formed by using a single film-forming process, and then a patterning process is performed to form specific patterns in different regions. Depending on different specific patterns, the patterning process may include at least one exposure, development and etching process. Each specific pattern may be continuous or discontinuous, and these specific patterns may also be at different heights or have different thicknesses.

In some examples, as shown in FIG. 6D, the signal line 131 may be electrically connected to the bonding region BB by the conductive pattern 170. It can be understood that since the conductive pattern 170 has a strong current carrying capacity, the signal line 131 is provided to be electrically connected to the bonding pin in the bonding region BB by the conductive pattern 170, and thus the reliability of electrical connection between the signal line 131 and the bonding pin may be improved.

In some examples, the width of the conductive pattern 170 in the first direction X is about 12.5 mm, so as to improve the current carrying capacity of the conductive pattern 170, thereby improving the reliability of electrical connection between the signal line 131 and the bonding pin.

In some examples, as shown in FIG. 6E, at least two signal lines 131 in a signal line group 130 are electrically connected by the conductive pattern 170 and the conductive portion 147. It can be understood that since the conductive pattern 170 can conduct electricity, the voltage drop of the signal line 131 may be compensated.

That is, the provision of the conductive pattern 170 being electrically connected to the signal line 131 may reduce the resistance of the signal transmission path (i.e., the signal line 131 and the conductive pattern 170 after electrical connection), and reduce the voltage drop of the signal transmission path (i.e., the signal line 131 and the conductive pattern 170 after electrical connection), thereby reducing the voltage drop of the signal line 131. In this way, the loss of the signal during transmission may be reduced, the transmission reliability of the signal may be improved, and the luminous efficiency of the electronic element 120 may be improved.

It can be understood that the voltage drop of the signal line 131 may be reduced after the conductive pattern 170 is electrically connected to the signal line 131. Therefore, even if the width of the signal line 131 in the first direction X is set small, or the thickness of the signal line 131 is set small, the voltage drop of the signal line 131 may still meet the demand through the compensation effect of the conductive pattern 170.

That is, by providing the conductive pattern 170 to be electrically connected to the signal line 131, it is helpful to reduce the width of the signal line 131 in the first direction X, and thus an occupied space of the signal line 131 on the base 101 is reduced, thereby increasing the wiring convenience of the substrate 100, which is beneficial to achieving the narrow frame of substrate 100. Moreover, it is also helpful t to reduce the thickness of the signal line 131, thereby reducing the amount of the material used for the signal line 131 and reducing the cost of the substrate 100.

For example, according to different requirements, an area of the orthographic projection of the conductive pattern 170 on the base 101 may vary, so as to improve the applicability of the substrate 100.

In some examples, as shown in FIG. 6F, at least one signal line 131 in at least one signal line group 130 includes at least two sub-sections 1311 spaced apart in the second direction Y, and two adjacent sub-sections 1311 in the same signal line 131 are electrically connected by the conductive portion 147.

It can be seen from the above that some (one or more) of the signal lines 131 includes first line segments 131d. The first line segment 131d is located between two adjacent first pads 1312, which increases the risk of breakage of the first line segment 131d and the risk of short circuit between the first line segment 131d and the first pad 1312.

In some examples, as shown in FIG. 6F, two sub-sections 1311 of the same signal line 131 are spaced apart in the second direction Y, and other signal lines 131 (e.g., the second voltage line 161) are located between the two sub-sections 1311 spaced apart. It can be understood that by providing two adjacent sub-sections 1311 of the same signal line 131 to be electrically connected by the conductive portion 147, there is no need to provide the first line segment 131*d* between the two adjacent first pads 1312.

It can be understood that the two sub-sections 1311 are electrically connected by the conductive portion 147 without providing the first line segment 131*d*. Therefore, breakage or heating of the first line segment 131*d* located between the two adjacent first pads 1312 may be avoided, thereby improving the reliability of the substrate 100. In addition, short circuit between the first line segment 131*d* and the first pad 1312 may be avoided, thereby improving the yield of the substrate 100. Moreover, since there is no first line segment 131*d* between the two adjacent first pads 1312, a single first soldered hole M2 may be provided to expose a plurality of first pads 1312, thereby simplifying the process for manufacturing the substrate 100 and reducing the cost of the substrate 100.

In addition, the electrical connection between the two sub-sections 1311 is achieved by the conductive portion 147, so that the length of each sub-sections 1311 may be shortened, thereby reducing defects such as breakage or heating due to excessive length of the signal line 131, and thus improving the reliability of the substrate 100. It can be understood that the lengths of the sub-sections 1311 included in a signal line 131 may be the same or different. The distances each between two adjacent sub-sections 1311 in the second direction Y may be the same or different.

In some examples, the conductive portion 147 is located on a side of two adjacent first pads 1312 in the first direction X.

It can be understood that by adjusting the width and thickness of the conductive portion 147, the current carrying capacity of the conductive portion 147 may be adjusted. In some examples, the width and thickness of the conductive portion 147 may increase, so that the conductive portion 147 has a great current carrying capacity. It can be understood that the greater the current carrying capacity of the conductive portion 147, the smaller the current carrying capacity set for the sub-section 1311, which is beneficial to reducing the width of the sub-section 1311 in the first direction X and the thickness of the sub-section 1311, thereby being beneficial to achieve the narrow frame of the substrate 100 and reducing the cost of the substrate 100.

In some other examples, the width and thickness of the conductive portion 147 may be reduced, so that the conductive portion 147 has a small current carrying capacity, so as to meet different usage requirements and improve the applicability of the substrate 100.

It can be seen from the above that, the substrate 100 includes a second reflective layer 194, and the second reflective layer 194 covers the plurality of signal line groups 130. In some examples, the second reflective layer 194 is provided with a third soldered hole M4 (referring to FIG. 8A) therein. The third soldered hole M4 penetrates the second reflective layer 194 in a direction perpendicular to the base 101, so as to expose a portion of the sub-section 1311. For example, as shown in FIG. 6G, a portion of the sub-section 1311 exposed by the third soldered hole M4 may be called a third pad 1314.

In some examples, a plurality of third pads 1314 may be provided in a sub-section 1311. In some other examples, only one third pad 1314 may be provided in a sub-section 1311.

An end of the conductive portion 147 is soldered to a third pad 1314 in a sub-section 1311, and another end thereof is soldered to a third pad 1314 in another sub-section 1311, so that the two sub-sections 1311 spaced apart in the second direction Y may be electrically connected by the conductive portion 147.

In some examples, a third soldered hole M4 exposes a third pad 1314, so that the second reflective layer 194 may cover a line located between the two third pads 1314, so as to avoid short circuit between the conductive portion 147 and the line located between the two third pads 1314, thereby improving the reliability of the substrate 100. It can be understood that the passivation layer 109 may expose the third pad 1314.

In some examples, areas of the orthographic projections of the plurality of third pads 1314 on the base 101 may be the same or different.

In some examples, a size of the third pad 1314 is directly related to a size of an end of the conductive portion 147 soldered to the third pad 1314. That is, the larger the area of the orthographic projection of the end of the conductive portion 147 soldered to the third pad 1314 on the base 101, the larger the area of the orthographic projection of the third pad 1314 on the base 101.

In some examples, the shape of the orthographic projection of the end of the conductive portion 147 soldered to the third pad 1314 on the base 101 is a rectangle, the length of the rectangle is 1.5 mm and the width of the rectangle is 1 mm. For example, a ratio of the area of the orthographic projection of the end of the conductive portion 147 soldered to the third pad 1314 on the base 101 to an area of the orthographic projection of the third pad 1314 soldered to the end of the conductive portion 147 on the base 101 is in a range of 0.8 to 2, inclusive.

In some examples, the area of the orthographic projection of the end of the conductive portion 147 soldered to the third pad 1314 on the base 101 may be less than the area of the orthographic projection of the third pad 1314 soldered to the end of the conductive portion 147 on the base 101.

For example, the ratio of the area of the orthographic projection of the end of the conductive portion 147 soldered to the third pad 1314 on the base 101 to the area of the orthographic projection of the third pad 1314 soldered to the end of the conductive portion 147 on the base 101 may be 0.9, 1.0, 1.5 or 1.8.

In some examples, at least part of a side of any bridging portion 140 away from the base 101 may reflect light.

It can be seen from the above that the substrate 100 may be used to provide a light source. The second reflective layer 194 covers the plurality of signal line groups 130 and the plurality of connection lines 112 and may play a role of reflecting light, thereby improving the brightness of the substrate 100 and reducing the power consumption of the substrate 100.

It can be understood that the part of the bridging portion 140 is located on a side of the second reflective layer 194 away from the base 101, that is, the bridging portion 140 may cover a part of the second reflective layer 194. Therefore, at least part of the side of any bridging portion 140 away from the base 101 may reflect light.

In this way, the intensity of light absorbed by the bridging portion 140 is reduced, the phenomena of black spots or shadows on the substrate 100 caused by the bridging portion 140 may be improved, the influence of the bridging portion 140 on the brightness of the substrate 100 may be reduced, and the optical performance of the substrate 100 may be improved. That is, the provision of at least part of the side of any bridging portion 140 away from the base 101 being capable of reflecting light may improve the utilization rate of light incident on the region where the bridging portion 140 is located on the substrate 100.

It can be understood that the side of the bridging portion 140 away from the base 101 may be a surface on a side of the bridging portion 140 away from the base 101, or a position between the surface on the side of the bridging portion 140 away from the base 101 and a surface on a side of the bridging portion 140 proximate to the base 101.

In some examples, at least part of a surface of the conductive portion 147 away from the base 101 may reflect light.

In some examples, at least part of the surface of the conductive portion 147 away from the base 101 may be set white, so that the at least part of the surface of the conductive portion 147 away from the base 101 may reflect light.

It can be seen from the above that the conductive portion 147 may be made of a conductive material, or may be a capacitor, a resistor, or the like. In some examples, in a case where the conductive portion 147 is made of the conductive material, the conductive portion 147 may be configured to include a white conductive material, so as to reflect light. In some examples, considering an example of the conductive portion 147 being a resistor, a surface of the resistor away from the base 101 may be set white, so as to reflect light.

It can be understood that the provision of at least part of the surface of the conductive portion 147 away from the base 101 being capable of reflecting light may improve the utilization rate of light incident on a region where the bridging portion 140 is located on the substrate 100, improve the brightness uniformity of the substrate 100 at different positions, improve the brightness of the substrate 100, reduce the power consumption of the substrate 100, and improve the optical performance of the substrate 100.

It can be understood that for different bridging portions 140, shapes and areas of reflective regions of the surfaces of the conductive portions 147 away from the base 101 may be the same or different. In some examples, the whole region of the surface of each bridging portion 140 away from the base 101 may reflect light.

FIG. 7A is a sectional view taken along a C1-C1 direction in FIG. 6F. FIG. 7B is another sectional view taken along a C1-C1 direction in FIG. 6F. FIG. 7C is yet another sectional view taken along a C1-C1 direction in FIG. 6F. FIG. 7D is yet another sectional view taken along a C1-C1 direction in FIG. 6F.

It will be noted that FIGS. 7A to 7D are sectional views taken along a C1-C1 direction in FIG. 6F under different embodiments. The bridging portion 140 will be illustrated below with reference to FIGS. 7A to 7D.

It can be seen from the above that the second reflective layer 194 is provided with the third soldered hole M4 therein, and the sub-section 1311 exposed by the third soldered hole M4 may form the third pad 1314. In some examples, as shown in FIG. 7A, an edge of the third soldered hole M4 is spaced apart from an edge of the sub-section 1311. In some other examples, as shown in FIG. 7B, the edge of the third soldered hole M4 is overlapped with the edge of the sub-section 1311.

In some examples, as shown in FIGS. 7A to 7D, the bridging portion 140 further includes a first encapsulation portion 148, and the first encapsulation portion 148 covers the conductive portion 147. The material of the first encapsulation portion 148 includes at least one of a transparent material and a reflective material.

It can be understood that the first encapsulation portion 148 covers the conductive portion 147, so as to play a role of protecting the conductive portion 147, reduce corrosion to the conductive portion 147 caused by external moisture or oxygen, and prolong the life of the conductive portion 147. In some examples, the first encapsulation portion 148 is made of an insulating material, thereby playing a role of electrical isolation, reducing the risk of short circuit between the conductive portion 147 and other conductive structures, and improving the reliability of the substrate 100.

In some examples, as shown in FIGS. 7A to 7D, the first encapsulation portion 148 may not only cover the conductive portion 147, but also cover a region of the second reflective layer 194 located at the peripheral of the conductive portion 147. That is, the first encapsulation portion 148 may be overlapped with the region of the second reflective layer 194 at the peripheral of the conductive portion 147, thereby improving the encapsulation protection effect of the first encapsulation portion 148 on the conductive portion 147.

In some examples, as shown in FIGS. 7A and 7B, the first encapsulation portion 148 may cover a large region of the second reflective layer 194 at the peripheral of the conductive portion 147. In some other examples, as shown in FIGS. 7C and 7D, the first encapsulation portion 148 may only cover a small region of the second reflective layer 194 at the peripheral of the conductive portion 147.

In some examples, in a case where the material of the first encapsulation portion 148 includes a transparent material, the light may pass through the first encapsulation portion 148 to be irradiated on a surface of the conductive portion 147 away from the base 101, and exit from the substrate 100 through the first encapsulation portion 148 due to action of reflection of the surface of the conductive portion 147 away from the base 101.

In some examples, in a case where the material of the first encapsulation portion 148 includes a reflective material, the light irradiated on the bridging portion 140 may be irradiated out of the substrate 100 due to the action of reflection of the first encapsulation portion 148.

That is, in the case where the material of the first encapsulation portion 148 includes the transparent material, the light may be irradiated out of the substrate 100 due to the action of reflection of the conductive portion 147; and in the case where the material of the first encapsulation portion 148 includes the reflective material, the light may be irradiated out of the substrate 100 due to the action of reflection of the first encapsulation portion 148.

In some examples, the material of the first encapsulation portion 148 includes a transparent material and a reflective material, so that the light may be irradiated out of the substrate 100 due to the action of reflection of both the conductive portion 147 and the first encapsulation portion 148.

It can be understood that in a case where at least part of the surface of the conductive portion 147 away from the base 101 may reflect light, and the first encapsulation portion 148 includes a reflective material, even if the light passes through the first encapsulation portion 148, the light may be reflected by the surface of the conductive portion 147 away from the base 101, thereby improving the brightness of the substrate 100 and reducing the influence of the bridging portion 140 on the brightness of the substrate 100.

In some examples, in a case where the first encapsulation portion 148 includes a reflective material, the material of the first encapsulation portion 148 may include white ink or white adhesive. For example, the white ink may be at least one of a photosensitive white ink and a curable white ink. In a case where the first encapsulation portion 148 includes a transparent material, the material of the first encapsulation portion 148 may include transparent adhesive.

In some other examples, the surface of the conductive portion 147 away from the base 101 cannot reflect light. In this case, at least part of the surface of the first encapsulation portion 148 away from the base 101 may reflect light.

That is, in a case where the surface of the conductive portion 147 away from the base 101 cannot reflect light, at least part of the surface of the first encapsulation portion 148 away from the base 101 may be provided to reflect light. Since the first encapsulation portion 148 covers the conductive portion 147, the light irradiated to the bridging portion 140 may be irradiated outside the substrate 100 due to the action of reflection of the first encapsulation portion 148, thereby reducing the influence of the bridging portion 140 on the brightness of the substrate 100. Thus, the utilization rate of light incident on the region where the bridging portion 140 is located on the substrate 100 may be improved, and the brightness uniformity of the substrate 100 may be improved.

It can be understood that the surface of the conductive portion 147 away from the base 101 is provided not to be capable of reflecting light, and the first encapsulation portion 148 may play a role of reflecting light, thereby simplifying the process for manufacturing the substrate 100 and reducing the cost of the substrate 100.

In some examples, the material of the first encapsulation portion 148 includes a reflective material, so that at least part of the surface of the first encapsulation portion 148 away from the base 101 may reflect light. For example, the reflective material may be white ink or white adhesive. For example, the white ink may be at least one of a photosensitive white ink and a curable white ink.

In some examples, as shown in FIGS. 7B and 7C, the conductive portion 147 is a chip resistor or a conductive adhesive.

It can be seen from the above that the conductive portion 147 is used for conducting electricity. In some examples, as shown in FIG. 7C, the conductive portion 147 is a chip resistor. It can be understood that the chip resistor includes two pins, where a pin is soldered to a third pad 1314 in a sub-section 1311, and the other pin is soldered to a third pad 1314 in another sub-section 1311. As a result, the chip resistor may electrically connect the two sub-sections 1311 provided at intervals.

In some other examples, the conductive portion 147 may be another conductive device, such as a capacitor. It can be understood that the conductive portion 147 being set as different conductive devices may have different control effects on the current flowing through the conductive portion 147, so as to meet different usage requirements.

In yet other examples, the conductive portion 147 may be a metal sheet or a metal line, such as a copper sheet, an aluminum sheet, a copper line or an aluminum line. Alternatively, the conductive portion 147 may be a conductive tape.

The method for manufacturing the substrate 100 will be described below by considering an example where the conductive portion 147 is a chip resistor or a conductive adhesive.

It can be seen from the above that the passivation layer 109 may expose the pads (including the first pad 1312, the second pad 1313, and the third pad 1314). In some examples, before the second reflective layer 194 is formed, the pads (including the first pads 1312, the second pads 1313 and the third pads 1314) exposed by the passivation layer 109 may be subjected to an electroless nickel/immersion gold process treatment. It can be understood that the electroless nickel/immersion gold process is a process that a nickel-gold layer is formed on surfaces of the pads away from the base 101 by chemical oxidation and reduction to improve corrosion-resistant of the pads (including the first pads 1312, the second pads 1313 and the third pads 1314), thereby improving the soldering effect.

In some other examples, before the passivation layer 109 is formed, an organic solderability preservatives (OSP) process treatment may be performed on the surfaces of the plurality of signal line groups 130 away from the base 101 and the surfaces of the plurality of connection lines 112 away from the base 101. It can be understood that the OSP process treatment is a process that an organic protective layer is formed on surfaces of the signal line groups 130 and the connection lines 112 away from the base 101 to improve the oxidation phenomenon of the signal line groups 130 and the connection lines 112. It can be understood that after the OSP process treatment is performed on the signal line groups 130 and the connection lines 112, there is no need to perform an electroless nickel/immersion gold process treatment on the pads (including the first pads 1312, the second pads 1313, and the third pads 1314).

It can be seen from the above that after the passivation layer 109 is formed, a patterned second reflective layer 194 may be formed on a side of the passivation layer 109 away from the base 101, so that the second reflective layer 194 may expose the first pads 1312, the second pads 1313 and the third pads 1314.

In some examples, in a case where the conductive portion 147 is a chip resistor, the pins of the chip resistor may be soldered to the third pads 1314 by a soldering process. That is, the electronic element 120 is soldered to the second pads 1313, the first driver chip 103 is soldered to the first pads 1312, and the chip resistor is soldered to the third pads 1314.

For example, solder may be prefabricated on the pins of the electronic element 120. Alternatively, solder may be added on the second pads 1313 by coating. Similarly, solder may be prefabricated on the pins of the first driver chip 103. Alternatively, solder may be added on the first pads 1312 by coating. Moreover, solder may be prefabricated on ends of the chip resistor. Alternatively, solder may be added on third pads 1314 by coating. For example, the solder may be soldering tin.

For example, a die bond process may be used to place the electronic element 120 on a side of the second pads 1313 away from the base 101, and place the first driver chip 103 on a side of the first pads 1312 away from the base 101. For example, a surface mounted technology (SMT) may be used to place the chip resistor on a side of the third pads 1314 away from the base 101 through attachment equipment (e.g., a chip mounter). A reflow soldering process may be used to solder the electronic element 120 to the second pads 1313, solder the first driver chip 103 to the first pads 1312, and solder the chip resistor to the third pads 1314.

In some other examples, in a case where the conductive portion 147 is a conductive adhesive, a printing process or print process may be used to electrically connect the conductive adhesive and the third pads 1314. For example, the conductive adhesive may be silver adhesive, nano silver adhesive, or copper adhesive.

In some examples, the conductive adhesive may be formed after the electronic element 120 is soldered to the second pads 1313 and the first driver chip 103 is soldered to the first pads 1312.

In some examples, the conductive adhesive may be formed by a printing process through a pneumatic valve or solenoid valve. In some other examples, the conductive adhesive may be formed by a print process through prefabricating a steel mesh and other steps.

It can be understood that, after the conductive adhesive is formed, the conductive adhesive needs to be cured at a high temperature. Taking an example of the conductive adhesive being Ag adhesive (i.e., silver adhesive), the curing temperature may be about 150° C. and the curing time may be about 1 hour.

It can be understood that if the length, width and thickness of the conductive adhesive varies, the resistance of the conductive adhesive will vary. The values of the resistances of the conductive adhesives with different lengths, widths, and thicknesses are exemplarily illustrated with reference to Table 1 by considering an example of the conductive adhesive being Ag adhesive (i.e., silver adhesive).

TABLE 1

| Material | Resistivity Ohm · meter $(\Omega \cdot m)$ | Curing temperature $(^\circ C.)$ | Curing time (Hour) | Length (m) | Width (mm) | Thickness $(\mu m)$ | Theoretical resistance $(\Omega)$ | Measured resistance $(\Omega)$ |
|---|---|---|---|---|---|---|---|---|
| Ag adhesive | 1.65E–07 $(1.65 \times 10^{-7})$ | 150 | 2 | 1.185 | 2 | 61 | 2 | 1.6 |
| | 7.00E–07 $(7.00 \times 10^{-7})$ | 150 | 0.5 | 1.41 | 0.463 | 111 | 19 | 21 |
| | 5.34E–07 $(5.34 \times 10^{-7})$ | 150 | 1 | 1.11 | 1.237 | 100 | 5 | 4.8 |

As shown in Table 1, the conductive portions 147 are formed using Ag adhesives with different resistivities by needle coating. The Ag adhesives have different resistance values under different lengths, widths, and thicknesses.

For example, for the Cu line formed by electroplating or magnetron sputtering, the resistivity of the Cu line is set to 1.75E-08 $(1.75 \times 10^{-8})$, the length of the Cu line is set to 1 m, the width of the Cu line is set to 0.31 mm, and the thickness of the Cu line is set to 2.7 $\mu m$, and the resistance value of the Cu line is about 21$\Omega$. That is, Ag adhesive is used as the conductive portion 147, and by controlling the length, width, thickness of the Ag adhesive, the resistance value of the Ag adhesive may be the same as the resistance value of the Cu line, or even less than the resistance value of the Cu line. Therefore, the voltage drop of the conductive portion 147 may be reduced, and the reliability of the substrate 100 may be improved.

In some examples, after the conductive portion 147 is formed, the substrate 100 needs to be subjected to an electrical test (ET). For example, the substrate 100 may be powered on to observe whether the electronic element 120 can emit light. If the substrate 100 fails during the electrical test, rework (RW) needs to be performed on the failed component(s) (e.g., the electronic element(s) 120, the first driver chip(s) 103, or the conductive portion(s) 147).

FIG. 7E is a structural diagram of yet another substrate in accordance with some embodiments.

It can be seen from the above that, as shown in FIG. 7E, the second reflective layer 194 is provided with a second soldered hole M3. The second soldered hole M3 may expose the second pads 1313, and the electronic element 120 is soldered to the second pads 1313.

In some examples, as shown in FIG. 7E, the substrate 100 further includes a plurality of reflective portions 195, and a reflective portion 195 is provided adjacent to an edge of a second soldered hole M3. That is, the reflective portion 195 may surround the second pads 1313.

It can be understood that the reflective portion 195 may play a role of reflecting light. In some examples, the material of the reflective portion 195 includes white adhesive. In this way, after the light emitted by the electronic element 120 is irradiated to the reflective portion 195, the light may be irradiated outside the substrate 100 due to action of reflection of the reflective portion 195, thereby increasing the brightness of the substrate 100 and reducing the power consumption of the substrate 100.

In some examples, the reflective portion 195 may be formed by coating after the electronic element 120 is soldered to the second pads 1313.

In some examples, some (one or more) of the reflective portions 195 are provided adjacent to the edges of the second soldered holes M3 in one-to-one correspondence, and other (one or more) of the reflective portions 195 are provided adjacent to edges of the first soldered holes M2 in one-to-one correspondence, and yet other (one or more) of the reflective portions 195 are provided adjacent to edges of the third soldered holes M4 in one-to-one correspondence. That is, the reflective portions 195 may not only surround the second pads 1313, but also surround the first pads 1312 and the third pads 1314, so as to improve the reflection effect of the reflective portion 195 on light, thereby increasing the brightness of the substrate 100.

Figure 8A:
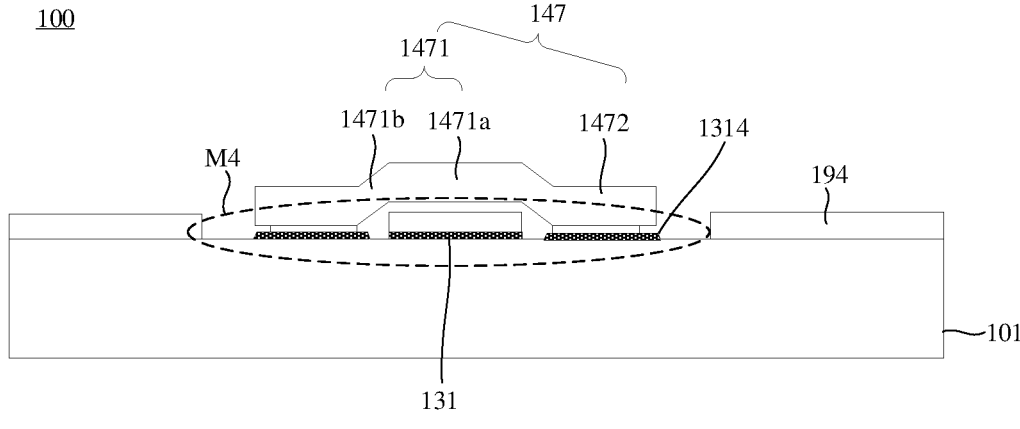
FIG. 8A is a structural diagram of yet another substrate, in accordance with some embodiments.
Figure 8B:
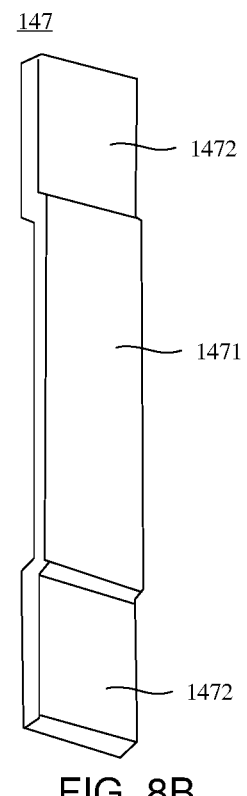
FIG. 8B is a structural diagram of a conductive portion, in accordance with some embodiments.
Figure 8C:
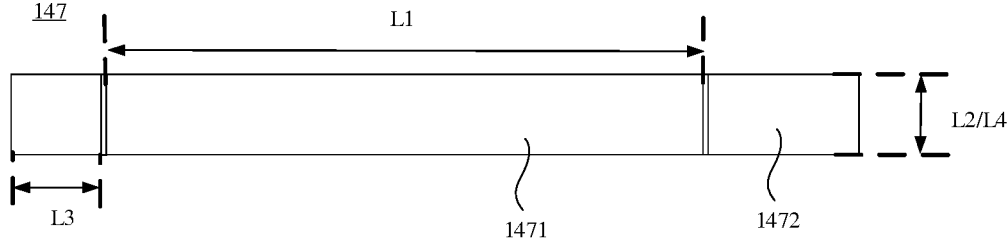
FIG. 8C is a structural diagram of another conductive portion, in accordance with some embodiments.
Figure 8D:
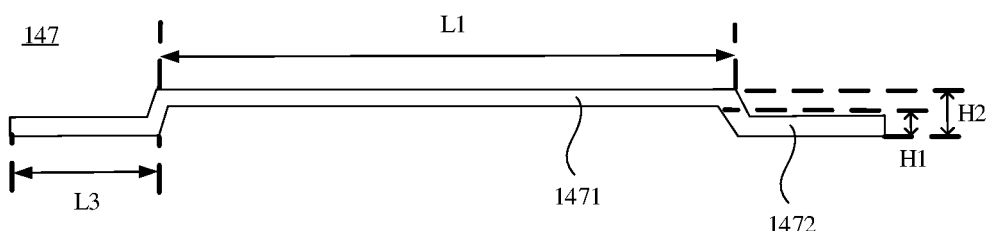
FIG. 8D is a structural diagram of yet another conductive portion, in accordance with some embodiments.

FIG. 8A is a structural diagram of yet another substrate in accordance with some embodiments. FIG. 8B is a structural diagram of a conductive portion in accordance with some embodiments. FIG. 8C is a structural diagram of another conductive portion in accordance with some embodiments. FIG. 8D is a structural diagram of yet another conductive portion in accordance with some embodiments.

In some examples, as shown in FIGS. 8A and 8B, the conductive portion 147 includes a main body portion 1471 and two connection portions 1472. The two connection portions 1472 are connected to both ends of the main body portion 1471, respectively. The maximum distance between a surface of the main body portion 1471 facing the base 101 and the base 101 is greater than the maximum distance between a surface of any connection portion 1472 facing the base 101 and the base 101.

It can be understood that the main body portion 1471 and the connection portions 1472 may be fixedly connected, or the main body portion 1471 and the connection portions 1472 may be detachably connected.

In some embodiments, as shown in FIGS. 8A and 8B, the main body portion 1471 includes a first main body sub-portion 1471a and second main body sub-portions 1471b. The number of the second main body sub-portions 1471b is two, and the two second main body sub-portions 1471b are respectively connected to both ends of the first main body sub-portion 1471a. Any connection portion 1472 is connected to an end of the second main body sub-portion 1471b away from the first main body sub-portion 1471a. It can be understood that the connection portion 1472 is used for soldering with the third pad 1314.

It can be understood that, as shown in FIG. 8A, the maximum distance between the surface of the main body portion 1471 facing the base 101 and the base 101 is the maximum distance between a surface of the first main body sub-portion 1471a facing the base 101 and a surface of the base 101 proximate to the main body portion 1471.

In some examples, an extending direction of the first main body sub-portion 1471a is parallel or approximately parallel to the base 101, that is, different portions of the surface of the first main body sub-portion 1471a facing the base 101 and the base 101 have the same or approximately the same distance.

It can be understood that, as shown in FIG. 8A, the maximum distance between the surface of the connection portion 1472 facing the base 101 and the base 101 is the maximum distance between the surface of the connection portion 1472 facing the base 101 and a surface of the base 101 proximate to the connection portion 1472.

In some examples, an extending direction of the connection portion 1472 is parallel or approximately parallel to the base 101, that is, different portions of the surface of the connection portion 1472 facing the base 101 and the base 101 have the same or approximately the same distance.

In some examples, an extension direction of the first main body sub-portion 1471a intersects an extension direction of the second main body sub-portion 1471b, so that the conductive portion 147 may be in a shape of an arch or approximately arch. As a result, the maximum distance between the surface of the main body portion 1471 facing the base 101 and the base 101 may be greater than the maximum distance between the surface of any connection portion 1472 facing the base 101 and the base 101.

It can be understood that, as shown in FIG. 8A, a signal line 131 is provided between two adjacent third pads 1314. Since the second reflective layer 194 covers the signal lines 131, the conductive portion 147 not only needs to cross the signal line 131, but also needs to cross the second reflective layer 194 covering the signal line 131.

The thickness of the second reflective layer 194 is usually thick. Therefore, the maximum distance between the surface of the main body 1471 facing the base 101 and the base 101 is set to be greater than the maximum distance between the surface of any connection portion 1472 facing the base 101 and the base 101, so that the main body portion 1471 may avoid the second reflective layer 194, thereby reducing mutual interference between the main body portion 1471 and the second reflective layer 194, improving the convenience and reliability of soldering between the conductive portion 147 and the third pads 1314, and thus improving the reliability of the substrate 100.

In some examples, as shown in FIGS. 8C and 8D, the shape of the orthographic projection of the main body portion 1471 on the base 101 is a first rectangle, the length L1 of the first rectangle is in a range of 0.5 mm to 25 mm, inclusive, and the width L2 of the first rectangle is in a range of 0.2 mm to 3 mm, inclusive.

In some examples, the length L1 of the first rectangle may be in a range of 3 mm to 20 mm, in a range of 5 mm to 15 mm, or in a range of 8 mm to 12 mm. In some examples, the length L1 of the first rectangle may take a value of 5.8 mm, 6.35 mm, 12 mm, 16 mm or 22 mm.

In some examples, the width L2 of the first rectangle may be in a range of 0.5 mm to 2.5 mm, in a range of 1 mm to 2 mm, or in a range of 1.2 mm to 1.8 mm. In some examples, the width L2 of the first rectangle may take a value of 0.85 mm, 1.0 mm, 2.2 mm or 2.8 mm.

In some examples, the shape of the orthographic projection of any connection portion 1472 on the base 101 is a second rectangle, the length L3 of the second rectangle is in a range of 0.2 mm to 3 mm, inclusive, and the width L4 of the second rectangle is in a range of 0.2 mm to 3 mm, inclusive.

In some examples, the length L3 of the second rectangle may be in a range of 0.5 mm to 2.5 mm, in a range of 1 mm to 2 mm, or in a range of 1.2 mm to 1.5 mm. In some examples, the length L3 of the second rectangle may take a value of 1 mm, 1.5 mm, 1.8 mm or 2.2 mm.

In some examples, the width L4 of the second rectangle may be in a range of 0.5 mm to 2.5 mm, in a range of 1 mm to 2 mm, or in a range of 1.2 mm to 1.5 mm. In some examples, the width L4 of the second rectangle may take a value of 1 mm, 1.5 mm, 1.8 mm or 2.2 mm.

In some examples, the width L4 of the second rectangle and the width L2 of the first rectangle may be the same or different.

It can be understood that by setting each of the length L1 of the first rectangle, the width L2 of the first rectangle, the length L3 of the second rectangle and the width L4 of the second rectangle to a varying value, two third pads 1314 with different distances may be electrically connected by the conductive portion 147, so as to meet different usage requirements and improve the applicability of the conductive portion 147.

In some examples, as shown in FIG. 8D, the maximum distance between the surface of the main body portion 1471 facing the base 101 and the surface of the connection portion 1472 facing the base 101 is the first distance H1, and the first distance H1 is in a range of 0.1 mm to 0.8 mm, inclusive.

In some examples, the first distance H1 is in a range of 0.2 mm to 0.6 mm, in a range of 0.3 mm to 0.5 mm, or in a range of 0.35 mm to 0.48 mm. In some examples, the first distance H1 may take a value of 0.2 mm, 0.30 mm or 0.7 mm.

In some examples, the maximum distance between the surface of the main body portion 1471 away from the base 101 and the surface of the connection portion 1472 facing the base 101 is the second distance H2, and the second distance H2 is in a range of 0.2 mm to 1 mm, inclusive.

In some examples, the second distance H2 is in a range of 0.25 mm to 0.9 mm, in a range of 0.3 mm to 0.8 mm, or in a range of 0.4 mm to 0.7 mm. In some examples, the second distance H2 may take a value of 0.3 mm, 0.50 mm or 0.8 mm.

It can be understood that setting each of the first distance H1 and the second distance H2 to a varying value may meet different usage requirements and improve reliability of the substrate 100.

It can be understood that a sum of the length L1 of the first rectangle and the lengths L3 of the second rectangles is a length of the orthographic projection of the conductive portion 147 on the base 101. In some examples, the length of the orthographic projection of the conductive portion 147 on the base 101 may be 5 mm, 9.6 mm or 15 mm.

Figure 9A:
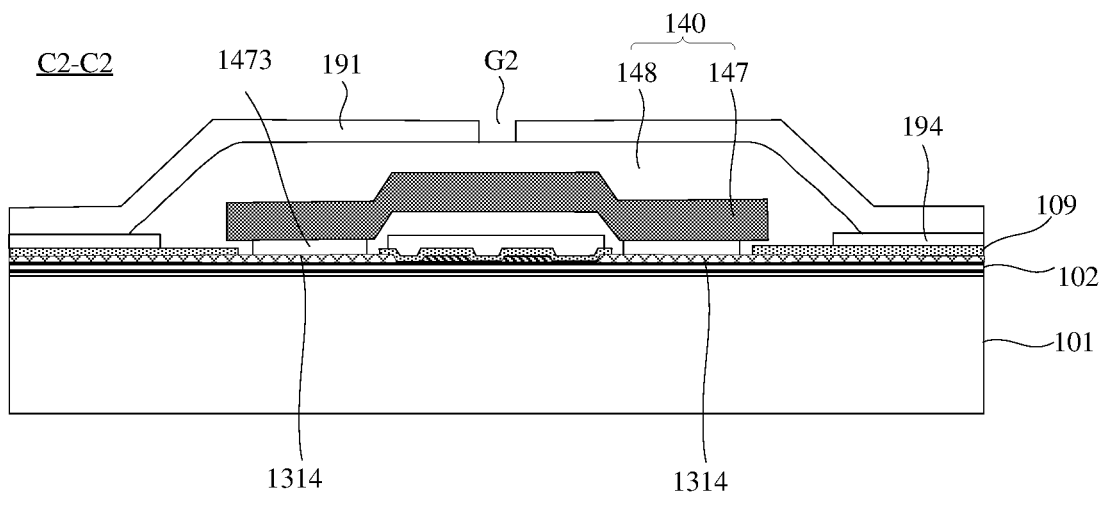
FIG. 9A is a sectional view taken along a C2-C2 direction in FIG. 6G.
Figure 9B:
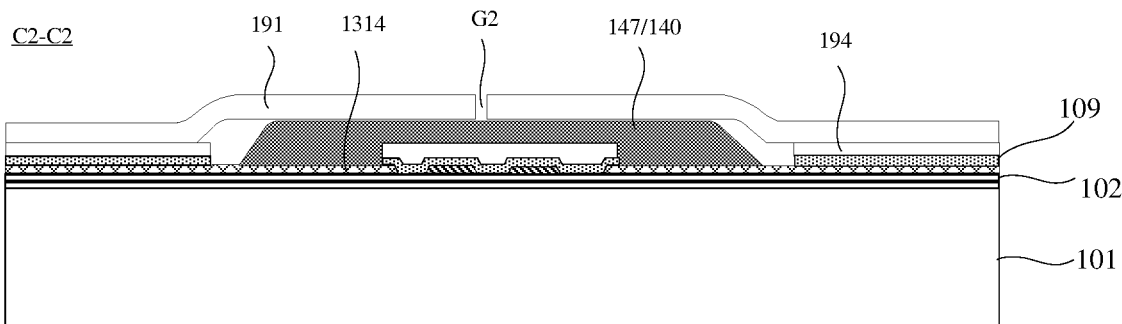
FIG. 9B is another sectional view taken along a C2-C2 direction in FIG. 6G.
Figure 9C:
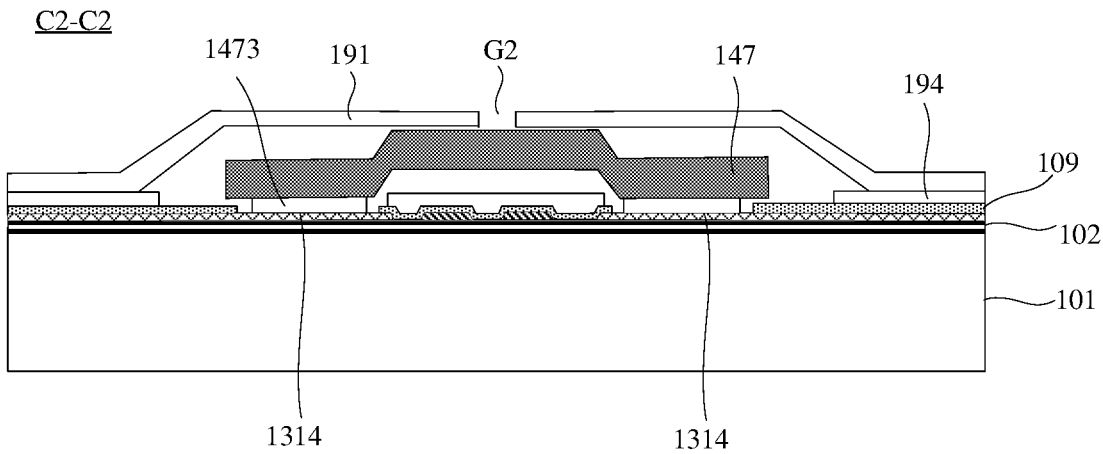
FIG. 9C is yet another sectional view taken along a C2-C2 direction in FIG. 6G.

FIG. 9A is a sectional view taken along a C2-C2 direction in FIG. 6G. FIG. 9B is another sectional view taken along a C2-C2 direction in FIG. 6G. FIG. 9C is yet another sectional view taken along a C2-C2 direction in FIG. 6G.

It will be noted that FIGS. 9A to 9C are sectional views taken along a C2-C2 direction in FIG. 6G under different embodiments. The following will continue to illustrate the substrate 100 with reference to FIGS. 9A to 9C.

In some examples, as shown in FIGS. 9A to 9C, the substrate 100 further includes a first reflective layer 191. The first reflective layer 191 is located on a side of the plurality of device groups 110, the plurality of signal line groups 130 and the plurality of bridging portions 140 away from the base 101.

It can be understood that the first reflective layer 191 plays a role of reflecting light. In some examples, the first reflective layer 191 is a reflector.

It can be seen from the above that, in some examples, as shown in FIG. 9A, the bridging portion 140 includes a conductive portion 147 and a first encapsulation portion 148, and the first encapsulation portion 148 covers the conductive portion 147. In this case, the first reflective layer 191 covers the plurality of bridging portions 140, that is, the first reflective layer 191 may be located on a side of the first encapsulation portion 148 away from the base 101.

In some other examples, as shown in FIGS. 9B and 9C, in a case where the bridging portion 140 only includes the conductive portion 147 but not includes the first encapsulation portion 148, the first reflective layer 191 covers the plurality of bridging portions 140, that is, the first reflective layer 191 may be located on a side of the conductive portion 147 away from the base 101.

It can be seen from the above that the conductive portion 147 may be made of a conductive material or may be a resistor. In some examples, as shown in FIG. 9B, in a case where the conductive portion 147 is made of the conductive material, the conductive material is soldered to the third pads 1314, and the first reflective layer 191 is located on a side of the conductive material away from the base 101. In some examples, the first reflective layer 191 may be stuck to a surface of the conductive material away from the base 101. In some other examples, there may be a gap between the first reflective layer 191 and the surface of the conductive material away from the base 101.

In some other examples, as shown in FIG. 9C, in a case where the conductive portion 147 is a resistor, the soldering portion 1473 of the resistor is soldered to the third pad 1314, and the first reflective layer 191 is located on a side of electrical components (e.g., the electronic elements 120, the first driver chips 103 or the bridging portions 140) away from the base 101. In some examples, the first reflective layer 191 may be stuck to a surface of the resistor away from the base 101. In some other examples, there may be a gap between the first reflective layer 191 and the surface of the resistor away from the base 101.

It can be understood that the first reflective layer 191 is provided to cover the plurality of device groups 110, the plurality of signal line groups 130 and the plurality of bridging portions 140, so that the first reflective layer 191 may play a role of reflecting light, thereby improving the brightness of the substrate 100 and reducing the power consumption of the substrate 100.

Figure 9D:
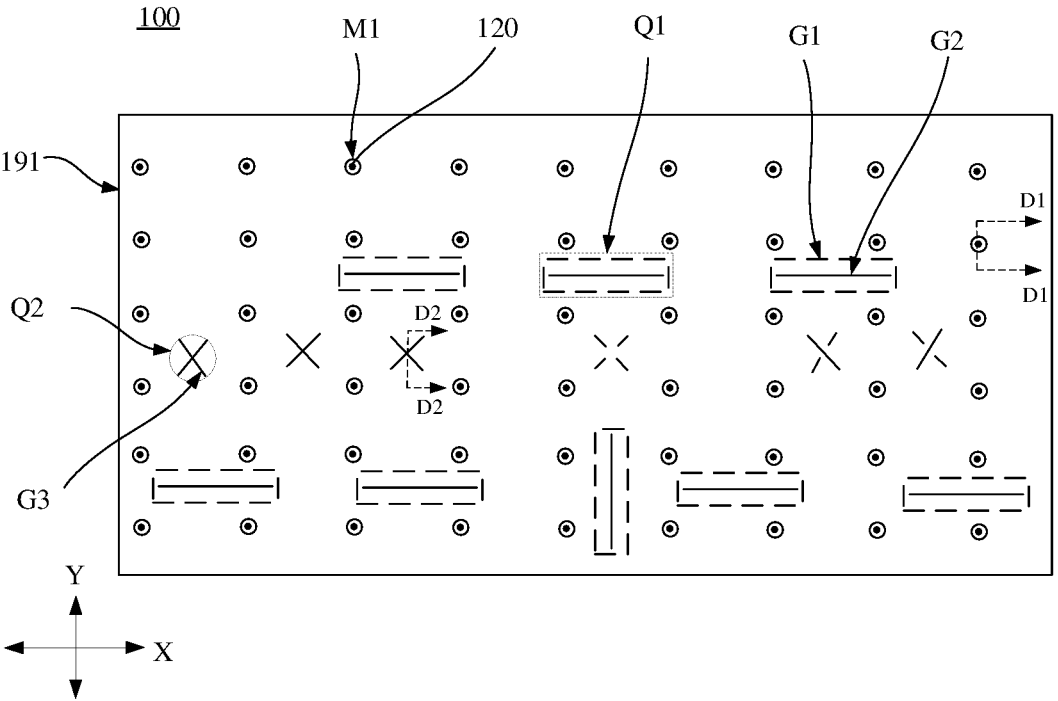
FIG. 9D is a structural diagram of yet another substrate, in accordance with some embodiments.

FIG. 9D is a structural diagram of yet another substrate in accordance with some embodiments.

As shown in FIG. 9D, the first reflective layer 191 has a plurality of first functional regions Q1, and the orthographic projection of the bridging portion 140 on the base 101 is located within an orthographic projection of a first functional region Q1 on the base 101. The first reflective layer 191 is provided with a plurality of first linear slits G1 therein, and any first linear slit G1 penetrates the first reflective layer 191 in a direction perpendicular to the base 101. Multiple first linear slits G1 spaced apart from each other surround to form the first functional region Q1.

It can be understood that the orthographic projection of the bridging portion 140 on the base 101 is located within the orthographic projection of the first functional region Q1 on the base 101. That is, the bridging portion 140 may be located within the first functional region Q1.

In some examples, the number of the first functional regions Q1 is the same as the number of the bridging portions 140, and an orthographic projection of a bridging portion 140 on the base 101 is located within an orthographic projection of a first functional region Q1 on the base 101. In some other examples, the number of the first functional regions Q1 is less than the number of the bridging portions 140, and orthographic projection(s) of one or more bridging portions 140 on the base 101 are located within an orthographic projection of a first functional region Q1 on the base 101.

It can be understood that the bridging portion 140 is located on a side of the plurality of signal line groups 130 away from the base 101, and the first reflective layer 191 covers the bridging portion 140. Therefore, any first linear slit G1 is provided to penetrate the first reflective layer 191 in a direction perpendicular to the base 101, so that the first linear slit G1 may play a role of absorbing stress of the first reflective layer 191 caused by the bridging portion 140.

In some examples, as shown in FIG. 9D, the multiple first linear slits G1 surround to form the first functional region Q1, and the bridging portion 140 is located in the first functional region Q1, so that the first linear slits G1 may absorb the stress of the first reflective layer 191 caused by the bridging portion 140, reduce the risk of detachment of the electrical components (e.g., the electronic elements 120, the first driver chips 103 or the bridging portions 140) caused by shrinking of the first reflective layer 191 due to action of the stress, and improve the reliability of the substrate 100.

In some examples, different first functional regions Q1 may be surrounded by different numbers of first linear slits G1. It can be understood that different first functional regions Q1 may have the same or different shapes and have the same or different areas.

In some examples, a ratio of the area of the orthographic projection of any bridging portion 140 on the base 101 to the area of the first functional region Q1 where the orthographic projection of the bridging portion 140 on the base 101 is located is in a range of 0.5 to 2, inclusive.

In some examples, a ratio of the area of the orthographic projection of any bridging portion 140 on the base 101 to the area of the first functional region Q1 where the orthographic projection of the bridging portion 140 on the base 101 may be in a range of 0.6 to 1.8, in a range of 0.8 to 1.5, or in a range of 0.9 to 1.4.

In some examples, a ratio of the area of the orthographic projection of any bridging portion 140 on the base 101 to the area of the first functional region Q1 where the orthographic projection of the bridging portion 140 on the base 101 is located may be 0.8, 0.9, 1.0 or 1.2.

It can be understood that the ratio of the area of the orthographic projection of any bridging portion 140 on the base 101 to the area of the first functional region Q1 where the orthographic projection of the bridging portion 140 on the base 101 is set to be in the range of 0.5 to 2, inclusive, so that an absolute value of a difference between the area of the orthographic projection of the bridging portion 140 on the base 101 and the area of the first functional region Q1 where the bridging portion 140 is located may be reduced, and the effect of the first linear slit G1 absorbing the stress may be improved, thereby improving the reliability of the substrate 100.

In some examples, the length of the first linear slit G1 is in a range of 1 mm to 5 mm, inclusive; and the width of the first linear slit G1 is in a range of 50 μm to 300 μm, inclusive.

In some examples, the length of the first linear slit G1 may be in a range of 1.5 mm to 4.5 mm, in a range of 2 mm to 4 mm, or in a range of 2.5 mm to 3.5 mm. In some examples, the length of the first linear slit G1 may take a value of 1.2 mm, 2.8 mm, 3.4 mm or 4.8 mm.

In some examples, the width of the first linear slit G1 may be in a range of 100 μm to 250 μm, in a range of 120 μm to 220 μm, or in a range of 150 μm to 200 μm. In some examples, the width of the first linear slit G1 may take a value of 80 μm, 120 μm, 220 μm, or 280 μm.

It can be understood that the lengths of the plurality of first linear slits G1 may be the same or different, and the widths of the plurality of first linear slits G1 may be the same or different.

It can be understood that setting the lengths of the first linear slits G1 to different values and setting the widths of the first linear slits G1 to different values may meet different usage requirements and improve the reliability of the substrate 100.

In some examples, as shown in FIGS. 9A to 9C, the first reflective layer 191 is provided with a plurality of second linear slits G2, and any second linear slit G2 penetrates the first reflective layer 191 in a direction perpendicular to the base 101. As shown in FIG. 9D, any second linear slit G2 is located in the first functional region Q1. An orthographic projection of an edge of the second linear slit G2 on the base 101 is at least partially overlapped with an orthographic projection of the bridging portion 140 on the base 101.

In some examples, the second linear slit G2 may extend in the first direction X. In some other examples, the second linear slit G2 may extend in the second direction Y. In still other examples, the second linear slit G2 may extend in a direction intersecting both the first direction X and the second direction Y.

It can be seen from the above that the orthographic projection of the bridging portion 140 on the base 101 is located within an orthographic projection of the first functional region Q1 on the base 101. In this way, the second linear slit G2 is provided to be located in the first functional region Q1, so that the orthographic projection of the edge of the second linear slit G2 on the base 101 may be at least partially overlapped with the orthographic projection of the bridging portion 140 on the base 101, that is, the position of the second linear slit G2 may correspond to the position of the bridging portion 140.

In some examples, the orthographic projection of the edge of the second linear slit G2 on the base 101 is located within the orthographic projection of the bridging portion 140 on the base 101.

It can be understood that the second linear slit G2 may absorb the stress of the first reflective layer 191 caused by the bridging portion 140, reduce the risk of detachment of the electrical components (e.g., the electronic elements 120, the first driver chips 103 or the bridging portions 140) caused by shrinking of the first reflective layer 191 due to action of the stress, and improve the reliability of the substrate 100.

It can be seen from the above that at least part of the side of any bridging portion 140 away from the base 101 may reflect light. In some examples, a region of the side of the bridging portion 140 away from the base 101 and exposed by the second linear slit G2 may reflect light, so as to reduce the influence of the bridging portion 140 on the brightness of the substrate 100. As a result, the utilization rate of light incident on the region where the bridging portion 140 is located on the substrate 100 may be improved, and the brightness uniformity of the substrate 100 may be improved.

In some other examples, a whole region of the side of the bridging portion 140 away from the base 101 may reflect light, thereby improving the reliability of the bridging portion 140 reflecting light.

In some examples, a ratio of the length of the second linear slit G2 to the length of the longest side of the bridging portion 140 is in a range of 0.9 to 1.5, inclusive.

It can be understood that the ratio of the length of the second linear slit G2 to the length of the longest side of the bridging portion 140 is a ratio of the length of the second linear slit G2 to the length of the longest side of the bridging portion 140, of which the orthographic projection on the base 101 is overlapped with the orthographic projection of the edge of the second linear slit G2 on the base 101.

It can be seen from the above that, in some examples, the bridging portion 140 includes the conductive portion 147 and the first encapsulation portion 148, and the first encapsulation portion 148 covers the conductive portion 147. In this case, the length of the longest side of the bridging portion 140 is the length of the longest side of the first encapsulation portion 148.

In some other examples, the bridging portion 140 only includes the conductive portion 147 but not include the first encapsulation portion 148. In this case, the length of the longest side of the bridging portion 140 is the length of the longest side of the conductive portion 147.

In some examples, a ratio of the length of the second linear slit G2 to the length of the longest side of the bridging portion 140 may be in a range of 0.95 to 1.3, in a range of 1.0 to 1.25, or in a range of 1.1 to 1.15. In some examples, the ratio of the length of the second linear slit G2 to the length of the longest side of the bridging portion 140 may be 0.95, 1.0, 1.1, or 1.2.

It can be understood that the ratio of the length of the second linear slit G2 to the length of the longest side of the bridging portion 140 is set to be in the range of 0.9 to 1.5, inclusive, so that an absolute value of a difference between the length of the second linear slit G2 and the length of the longest side of the bridging portion 140 may be reduced, and the effect of the second linear slit G2 absorbing the stress may be improved, thereby improving the reliability of the substrate 100.

In some examples, the length of the second linear slit G2 is in a range of 1 mm to 35 mm, inclusive; and the width of the second linear slit G2 is in a range of 50 μm to 300 μm, inclusive.

In some examples, the length of the second linear slit G2 may be in a range of 5 mm to 30 mm, in a range of 10 mm to 25 mm, or in a range of 15 mm to 20 mm. In some examples, the length of the second linear slit G2 may take a value of 1.2 mm, 8 mm, 12 mm, 18 mm, 22 mm, 25 mm, or 32 mm.

In some examples, the width of the second linear slit G2 may be in a range of 100 μm to 250 μm, in a range of 120 μm to 220 μm, or in a range of 150 μm to 200 μm. In some examples, the width of the second linear slit G2 may take a value of 80 μm, 120 μm, 220 μm, or 280 μm.

It can be understood that the length of the second linear slit G2 and the length of the first linear slit G1 may be the same or different, and the width of the second linear slit G2 and the width of the first linear slit G1 may be the same or different. The lengths of the plurality of second linear slits G2 may be the same or different, and the widths of the plurality of second linear slits G2 may be the same or different.

It can be understood that setting the lengths of the second linear slits G2 to different values and setting the widths of the second linear slits G2 to different values may meet different usage requirements and improve the reliability of the substrate 100.

Figure 9E:
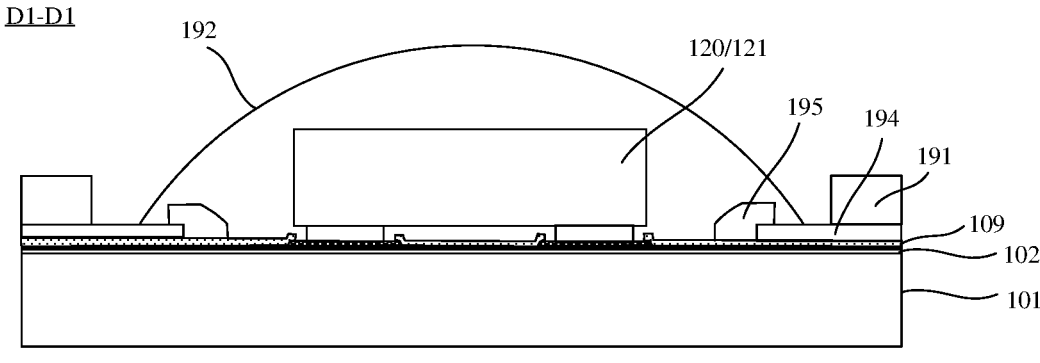
FIG. 9E is a sectional view taken along a D1-D1 direction in FIG. 9D.
Figure 9F:
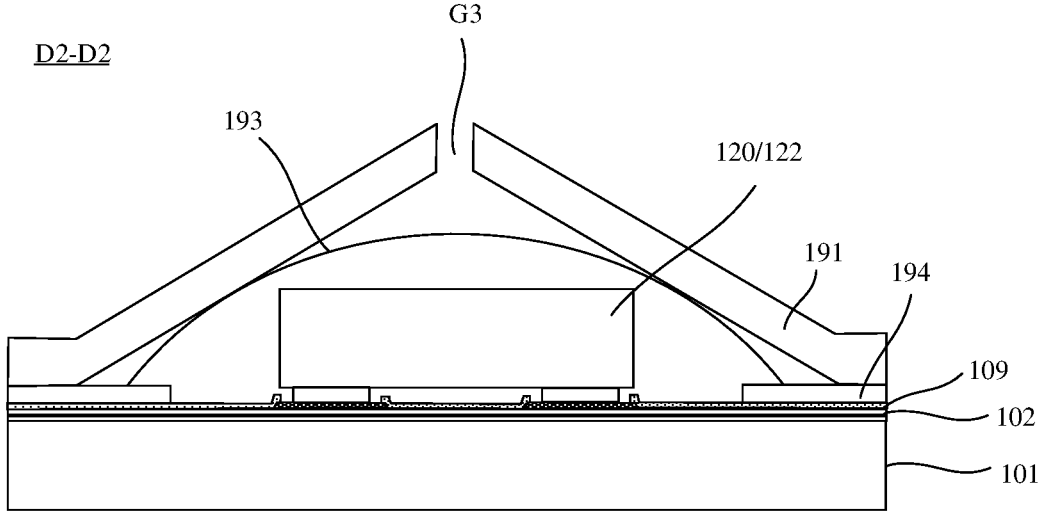
FIG. 9F is a sectional view taken along a D2-D2 direction in FIG. 9D.
Figure 9G:
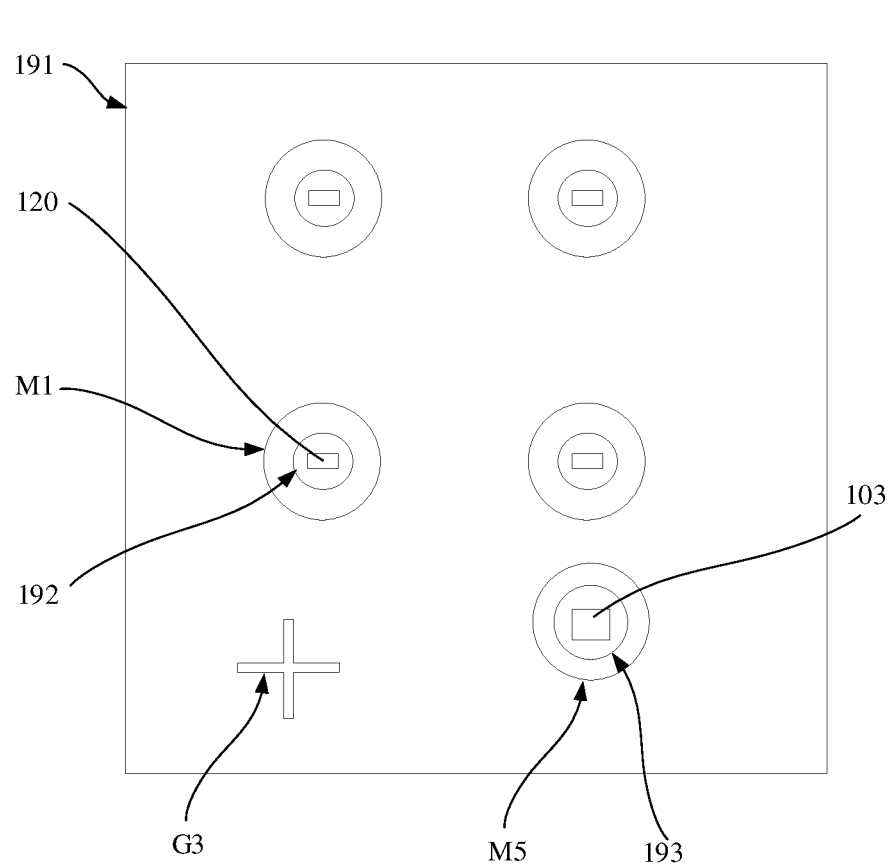
FIG. 9G is a structural diagram of yet another substrate, in accordance with some embodiments.

FIG. 9E is a sectional view taken along a D1-D1 direction in FIG. 9D. FIG. 9F is a sectional view taken along a D2-D2 direction in FIG. 9D. FIG. 9G is a structural diagram of yet another substrate in accordance with some embodiments.

It will be noted that, in some examples, the first reflective layer 191 may cover a non-optical element 122. Therefore, the non-optical element 122 is not shown in FIG. 9D. In some other examples, referring to FIG. 9G, the first reflective layer 191 may expose the non-optical element 122. The positional relationship between an optical element 121, the non-optical element 122 and the first reflective layer 191 will be exemplarity described below with reference to FIGS. 9D to 9G.

In some examples, as shown in FIG. 9E, the electronic element 120 includes an optical element 121. The substrate 100 further includes a second encapsulation portion 192. The second encapsulation portion 192 covers the optical element 121, and the material of the second encapsulation portion 192 is a transparent material.

In some examples, the optical element 121 may be a light-emitting device, such as a mini LED, for emitting light outward. In some other examples, the optical element 121 may be a photosensitive element, such as a photodiode or a phototriode, for converting the received optical signal into an electrical signal.

As shown in FIG. 9E, the second encapsulation portion 192 covers the optical element 121, thereby playing a role of protecting and encapsulating the optical element 121 and extending the service life of the optical element 121. In addition, the material of the second encapsulation portion 192 is a transparent material, and thus the blocking of light by the second encapsulation portion 192 may be reduced and the intensity of light capable of passing through the second encapsulation portion 192 may increase.

In this way, in a case where the optical element 121 is a light-emitting device (e.g., a mini LED), the light emitted by the optical element 121 may pass through the second encapsulation portion 192 to be irradiated outside the substrate 100. In a case where the optical element 121 is a photosensitive element, external light may pass through the second encapsulation portion 192 to be irradiated on the optical element 121. That is, the material of the second encapsulation portion 192 is provided to include the transparent material, and thus the influence of the second encapsulation portion 192 on the optical element 121 may be reduced, thereby improving the reliability of the substrate 100.

In some examples, the material of the second encapsulation portion 192 includes transparent adhesive.

In some examples, the encapsulation portion 192 may be in a shape of a mushroom or an approximate mushroom.

In some examples, as shown in FIG. 9D, the first reflective layer 191 is provided with first through holes M1 therein, and the orthographic projection of the optical element 121 on the base 101 is located within a region surrounded by the orthographic projection of the edge of the first through hole M1 on the base 101.

It can be understood that the optical element 121 needs to emit light outward or receive light from the outside. Therefore, the orthographic projection of the optical element 121 on the base 101 is provided to be located within the region surrounded by the orthographic projection of the edge of the first through hole M1 on the base 101, so that the optical element 121 may be exposed by the first through hole M1, so as to prevent the first reflective layer 191 from blocking the optical element 121, thereby improving the optical performance of the substrate 100.

In some examples, the orthographic projection of the second encapsulation portion 192 on the base 101 is also within the region surrounded by the orthographic projection of the edge of the first through hole M1 on the base 101, that is, the second encapsulation portion 192 may also be exposed by the first through hole M1.

In some examples, as shown in FIG. 9E, the electronic element 120 includes a non-optical element 122. The substrate 100 further includes a third encapsulation portion 193. The third encapsulation portion 193 covers the non-optical element 122, and the first reflective layer 191 covers the third encapsulation portion 193.

It can be understood that the non-optical element 122 is an electronic element that does not need to emit light and does not need to receive external light. In some examples, the non-optical element 122 may be a driver integrated circuit (IC) or a sensor.

As shown in FIG. 9F, the third encapsulation portion 193 covers the non-optical element 122, thereby playing a role of protecting and encapsulating the non-optical element 122 and extending the service life of the non-optical element 122.

In some examples, the material of the third encapsulation portion 193 may be a transparent material, such as transparent silicone. In some other examples, the material of the third encapsulation portion 193 may be a reflective material, such as white silicone. The embodiments of the present disclosure do not limit the material of the third encapsulation portion 193.

In some examples, as shown in FIGS. 9D and 9F, the first reflective layer 191 has a second functional region Q2, and at least part of the orthographic projection of the non-optical element 122 on the base 101 is located within the second functional region Q2. The first reflective layer 191 is provided with a plurality of third linear slits G3 therein. Any third linear slit G3 penetrates the first reflective layer 191 in a direction perpendicular to the base 101, and any third linear slit G3 is located in the second functional region Q2. The orthographic projection of the edge of the third linear slit G3 on the base 101 is at least partially overlapped with the orthographic projection of the non-optical element 122 on the base 101.

It can be understood that the orthographic projection of the non-optical element 122 on the base 101 is located within the orthographic projection of the second functional region Q2 on the base 101, which means that the non-optical element 122 may be located in the second functional region Q2.

In some examples, the number of the second functional regions Q2 is the same as the number of the non-optical elements 122, and an orthographic projection of a non-optical element 122 on the base 101 is located within an orthographic projection of a second functional region Q2 on the base 101. In some other examples, the number of the second functional regions Q2 is less than the number of the non-optical elements 122, and orthographic projections of one or more non-optical elements 122 on the base 101 are located within an orthographic projection of a second functional region Q2 on the base 101.

It can be understood that the non-optical element 122 is located on a side of the plurality of signal line groups 130 away from the base 101, the third encapsulation portion 193 covers the non-optical element 122, and the first reflective layer 191 covers the third encapsulation portion 193.

Therefore, any third linear slit G3 is provided to penetrate the first reflective layer 191 in a direction perpendicular to the base 101, any third linear slit G3 is provided to be located in the second functional region Q2, and the orthographic projection of the edge of the third linear slit G3 on the base 101 is provided to be at least partially overlapped with the orthographic projection of the non-optical element 122 on the base 101, so that the third linear slit G3 may play a role of absorbing stress of the first reflective layer 191 caused by the non-optical element 122 and the third encapsulation portion 193, reduce the risk of detachment of the electrical components (e.g., the electronic elements 120, the first driver chips 103 or the bridging portions 140) caused by shrinking of the first reflective layer 191 due to action of the stress, and improve the reliability of the substrate 100.

In some examples, the orthographic projection of the edge of the third linear slit G3 on the base 101 falls within the orthographic projection of the non-optical element 122 on the base 101.

In some examples, the number of the third linear slits G3 located in the same second functional region Q2 may be one or more. The numbers of the third linear slits G3 in different second functional regions Q2 may be the same or different.

In some examples, as shown in FIG. 9D, at least two third linear slits G3 are located in the same second functional region Q2, and orthographic projections of edges of the at least two third linear slits G3 located in the same second functional region Q2 on the base 101 may be arranged in an "X" shape.

In some examples, the number of the third linear slits G3 located in the same second functional region Q2 is two, and extending directions of the two third linear slits G3 located in the same second functional region Q2 intersect, so that orthographic projections of edges of the two third linear slits G3 located in the same second functional region Q2 on the base 101 may be arranged in an "X" shape.

In some other examples, as shown in FIG. 9D, the number of the third linear slits G3 located in the same second functional region Q2 may be three or four. For example, in a case where the number of the third linear slits G3 located in the same second functional region Q2 is three, two of the third linear slits G3 extend in the same direction and are spaced apart, and the other of the third linear slits G3 is located between the two third linear slits G3 spaced apart and extends in a direction intersecting the extending direction of the two third linear slits G3 spaced apart. As a result, orthographic projections of edges of the three third linear slits G3 located in the same second functional region Q2 on the base 101 may be arranged in an "X" shape.

For example, in a case where the number of the third linear slits G3 located in the same second functional region Q2 is four, two of the third linear slits G3 extend in a same direction and are spaced apart, and the other two of the third linear slits G3 extend in another same direction and are spaced apart. Moreover, the extension direction of the two third linear slits G3 with the same extension direction intersect the extension direction of the other two third linear slits G3 with the same extension direction, so that orthographic projections of edges of the four third linear slits G3 located in the same second functional region Q2 on the base 101 may be arranged in an "X" shape.

In yet some examples, the number of the third linear slits G3 located in the same second functional region Q2 may be five, six or more. The embodiments of the present disclosure do not further limit the number of the third linear slits G3 located in the same second functional region Q2.

It can be understood that the orthographic projections of the edges of at least two third linear slits G3 located in the same second functional region Q2 on the base 101 is arranged in an "X" shape, and thus the effect of the third linear slit G3 absorbing the stress of the reflective layer 191 may be improved, the risk of detachment of the electrical components (e.g., the electronic elements 120, the first driver chips 103 or the bridging portions 140) caused by shrinking of the first reflective layer 191 due to action of the stress may be reduced, thereby improving the reliability of the substrate 100.

In some other examples, as shown in FIG. 9G, the orthographic projections of the edges of the third linear slits G3 located in the same second functional region Q2 on the base 101 may be arranged in a "cross" shape.

In yet other examples, the orthographic projections of the edges of the third linear slits G3 located in the same second functional region Q2 on the base 101 may be arranged in a shape of a character "米".

It can be seen from the above that, in some examples, the first reflective layer 191 covers the third encapsulation portion 193. In some other examples, as shown in FIG. 9G, the first reflective layer 191 is provided with second through holes M5 therein. The second through holes M5 penetrates the first reflective layer 191 in a direction perpendicular to the base 101. The third encapsulation portion 193 and the non-optical element 122 may be exposed by the second through holes M5, so as to avoid stress of the first reflective layer 191 caused by the third encapsulation portion 193 and the non-optical element 122, reduce the risk of detachment of the electrical components (e.g., the electronic elements 120, the first driver chips 103 or the bridging portions 140) caused by shrinking of the first reflective layer 191 due to action of the stress, and improve the reliability of the substrate 100.

In some examples, as shown in FIG. 9D, two third linear slits G3 are located in the same second functional region Q2. A ratio of the length of the third linear slit G3 to the maximum size of the non-optical element 122 is in a range of 0.9 to 2.5, inclusive.

It can be understood that the ratio of the length of the third linear slit G3 to the maximum size of the non-optical element 122 is a ratio of the length of the third linear slit G3 to the maximum size of the non-optical element 122, of which the orthographic projection on the base 101 is overlapped with the orthographic projection of the edge of the third linear slit G3 on the base 101.

For example, in a case where the orthographic projection of the non-optical element 122 on the base 101 is in a shape of a square, a rectangle or another irregular polygon, the maximum size of the non-optical element 122 is a diagonal length of the orthographic projection of the non-optical element 122 on the base 101. In a case where the orthographic projection of the non-optical element 122 on the base 101 is in a shape of a circle or approximately a circle, the maximum size of the non-optical element 122 is a diameter of the orthographic projection of the non-optical element 122 on the base 101.

In some examples, the lengths of the two third linear slits G3 located in the same second functional region Q2 are the same or approximately the same. In some examples, the ratio of the length of the third linear slit G3 to the maximum size of the non-optical element 122 may be in a range of 0.95 to 2, in a range of 1 to 1.8, or in a range of 1.1 to 1.5. For example, the ratio of the length of the third linear slit G3 to the maximum size of the non-optical element 122 may be 0.95, 1.0, 1.5 or 2.2.

It can be understood that the ratio of the length of the third linear slit G3 to the maximum size of the non-optical element 122 is set to be in the range of 0.9 to 2.5, inclusive, so that an absolute value of a difference between the length of the third linear slit G3 and the maximum size of the non-optical element 122 may be reduced, and the effect of the third linear slit G3 absorbing the stress of the first reflective layer 191 may be improved, thereby improving the reliability of the substrate 100.

In some examples, a ratio of the length of the third linear slit G3 to the maximum size of the third encapsulation portion 193 is in a range of 0.9 to 2.5, inclusive.

It can be understood that the ratio of the length of the third linear slit G3 to the maximum size of the third encapsulation portion 193 is a ratio of the length of the third linear slit G3 to the maximum size of the third encapsulation portion 193, of which the orthographic projection on the base 101 is overlapped with the orthographic projection of the edge of the third linear slit G3 on the base 101.

For example, in a case where the orthographic projection of the third encapsulation portion 193 on the base 101 is in a shape of a square, a rectangle or another irregular polygon, the maximum size of the third encapsulation portion 193 is a diagonal length of the orthographic projection of the third encapsulation portion 193 on the base 101. In a case where the orthographic projection of the third encapsulation portion 193 on the base 101 is in a shape of a circle or approximately a circle, the maximum size of the third encapsulation portion 193 is a diameter of the orthographic projection of the third encapsulation portion 193 on the base 101.

In some examples, the lengths of the two third linear slits G3 located in the same second functional region Q2 are the same or approximately the same. In some examples, the ratio of the length of the third linear slit G3 to the maximum size of the third encapsulation portion 193 may be in a range of 0.95 to 2, in a range of 1 to 1.8, or in a range of 1.1 to 1.5. For example, the ratio of the length of the third linear slit G3 to the maximum size of the third encapsulation portion 193 may be 0.95, 1.0, 1.5 or 2.2.

It can be understood that the ratio of the length of the third linear slit G3 to the maximum size of the third encapsulation portion 193 is set to be in the range of 0.9 to 2.5, inclusive, so that an absolute value of a difference between the length of the third linear slit G3 and the maximum size of the third encapsulation portion 193 may be reduced, and the effect of the third linear slit G3 absorbing the stress of the first reflective layer 191 may be improved, thereby improving the reliability of the substrate 100.

In some examples, the first reflective layer 191 is provided with third through holes (not shown in the figures) therein. The substrate 100 further includes a support structure. An end of the support structure is connected to the second reflective layer 194 by a third through hole, and another end thereof extends in a direction away from the base 101. For example, an extension direction of the support structure is perpendicular or approximately perpendicular to the base 101.

It can be understood that the substrate 100 includes optical film layer(s) and a condenser lens for improving the light extraction rate of the substrate 100. The optical film layer(s) and the condenser lens are located on a side of the first reflective layer 191 away from the base 101, and the support structure plays a role of supporting the optical film layer(s) and the condenser lens.

In some examples, the support structure may be in a conical or conical frustum shape, so as to improve support reliability.

The foregoing descriptions are merely specific implementations of the present disclosure, but the protection scope of the present disclosure is not limited thereto. Changes or replacements that any person skilled in the art could conceive of within the technical scope of the present disclosure shall be included in the protection scope of the present disclosure. Therefore, the protection scope of the present disclosure shall be subject to the protection scope of the claims.

What is claimed is:

1. A substrate having a plurality of edges; the substrate comprising a device region and at least one bonding region, and the bonding region being disposed proximate to any edge of the substrate relative to the device region; the substrate comprising:

a base;

a plurality of device groups located on a side of the base and located in the device region, wherein the plurality of device groups are arranged in a first direction and a second direction, the first direction intersects the second direction, and the first direction and the second direction are parallel to the base; a device group includes at least one electronic element;

a plurality of signal line groups located on a same side of the base as the plurality of device groups, wherein a signal line group includes a plurality of signal lines, the plurality of signal lines all extend in the second direction, and the plurality of signal lines are disposed at intervals in the first direction; any signal line extends from the bonding region to the device region, and any signal line is electrically connected to a column of device groups arranged in the second direction; and a plurality of bridging portions located on the same side of the base as the plurality of device groups, wherein at least one bridging portion is located in the device region, and the at least one bridging portion includes a conductive portion; wherein the at least one bridging portion satisfies at least one of: at least two signal lines in at least one signal line group are electrically connected by a conductive portion; and at least one signal line in at least one signal line group includes at least two sub-portions disposed at intervals in the second direction, and two adjacent sub-portions in a same signal line are electrically connected by a conductive portion; and at least part of a side of any bridging portion away from the base is capable of reflecting light.

2. The substrate according to claim 1, wherein at least part of a surface of the conductive portion included in the at least one bridging portion away from the base is capable of reflecting light.

3. The substrate according to claim 2, wherein the at least one bridging portion further includes a first encapsulation portion, and the first encapsulation portion covers the conductive portion; and a material of the first encapsulation portion includes at least one of a transparent material and a reflective material.

4. The substrate according to claim 1, wherein the at least one bridging portion further includes a first encapsulation portion, and the first encapsulation portion covers the conductive portion; and at least part of a surface of the first encapsulation portion away from the base is capable of reflecting light.

5. The substrate according to claim 1, wherein the conductive portion includes:

a main body portion; and two connection portions, the two connection portions being connected to both ends of the main body portion; a maximum distance between a surface of the main body portion facing the base and the base being greater than a maximum distance between a surface of any connection portion facing the base and the base.

6. The substrate according to claim 5, wherein an orthographic projection of the main body portion on the base is in a shape of a first rectangle, and a length of the first rectangle is in a range of 0.5 mm to 25 mm, inclusive, and a width of the first rectangle is in a range of 0.2 mm to 3 mm, inclusive; and/or an orthographic projection of any connection portion on the base is in a shape of a second rectangle, a length of the second rectangle is in a range of 0.2 mm to 3 mm, inclusive, and a width of the second rectangle is in a range of 0.2 mm to 3 mm, inclusive.

7. The substrate according to claim 6, wherein a maximum distance between the surface of the main body portion facing the base and a surface of the connection portion facing the base is a first distance, and the first distance is in a range of 0.1 mm to 0.8 mm, inclusive; and/or a maximum distance between a surface of the main body portion away from the base and the surface of the connection portion facing the base is a second distance, and the second distance is in a range of 0.2 mm to 1 mm, inclusive.

8. The substrate according to claim 1, further comprising:

a first reflective layer located on a side of the plurality of device groups, the plurality of signal line groups and the plurality of bridging portions away from the base; wherein the first reflective layer has a plurality of first functional regions, and an orthographic projection of at least one bridging portion on the base is located within an orthographic projection of a first functional region on the base; and the first reflective layer is provided with a plurality of first linear slits therein, any first linear slit penetrates the first reflective layer in a direction perpendicular to the base; and the first functional region is composed of multiple first linear slits spaced apart from each other by surrounding.

9. The substrate according to claim 8, wherein a ratio of an area of an orthographic projection of any bridging portion on the base to an area of a first functional region where an orthographic projection of the bridging portion on the base is located is in a range of 0.5 to 2, inclusive.

10. The substrate according to claim 8, wherein a length of the first linear slit is in a range of 1 mm to 5 mm, inclusive; and a width of the first linear slit is in a range of 50 µm to 300 µm, inclusive.

11. The substrate according to claim 8, wherein the first reflective layer is provided with a plurality of second linear slits therein, any second linear slit penetrates the first reflective layer in the direction perpendicular to the base, and any second linear slit is located in the first functional region; and

an orthographic projection of an edge of the second linear slit on the base is at least partially overlapped with an orthographic projection of the bridging portion on the base.

12. The substrate according to claim 11, wherein a ratio of a length of the second linear slit to a length of a longest side of the bridging portion is in a range of 0.9 to 1.5, inclusive.

13. The substrate according to claim 11, wherein the length of the second linear slit is in a range of 1 mm to 35 mm, inclusive; and a width of the second linear slit is in a range of 50 µm to 300 µm, inclusive.

14. The substrate according to claim 1, wherein the electronic element includes an optical element; the substrate further comprises a second encapsulation portion, the second encapsulation portion covers the optical element, and a material of the second encapsulation portion is a transparent material; and the first reflective layer is provided with a first through hole therein, and an orthographic projection of the optical element on the base is located within a region surrounded by an orthographic projection of an edge of the first through hole on the base.

15. The substrate according to claim 1, wherein the electronic element includes a non-optical element; the substrate further comprises:

a third encapsulation portion, the third encapsulation portion covering the non-optical element, and the first reflective layer covering the third encapsulation portion.

16. The substrate according to claim 15, wherein the first reflective layer has a second functional region, and at least part of an orthographic projection of the non-optical element on the base is located within the second functional region;

the first reflective layer is provided with a plurality of third linear slits therein, any third linear slit penetrates the first reflective layer in the direction perpendicular to the base, and any third linear slit is located in the second functional region; and an orthographic projection of an edge of the third linear slit on the base is at least partially overlapped with the orthographic projection of the non-optical element on the base.

17. The substrate according to claim 16, wherein at least two third linear slits are located in a same second functional region, and orthographic projections of edges of the at least two third linear slits located in the same second functional region on the base are arranged in an "X" shape.

18. The substrate according to claim 17, wherein two third linear slits are located in the same second functional region;

a ratio of a length of the third linear slit to a maximum size of the non-optical element is in a range of 0.9 to 2.5, inclusive; and/or a ratio of the length of the third linear slit to a maximum size of the third encapsulation portion is in a range of 0.9 to 2.5, inclusive.

19. The substrate according to claim 1, wherein the conductive portion is a chip resistor or a conductive adhesive.

20. An electronic apparatus, comprising the substrate according to claim 1.

* * * * *